(12) United States Patent
Chang et al.

(10) Patent No.: US 9,270,253 B2
(45) Date of Patent: *Feb. 23, 2016

(54) HYBRID ACOUSTIC BARRIER AND ABSORBER

(71) Applicant: The Boeing Company, Chicago, IL (US)

(72) Inventors: Chia-Ming Chang, Agoura Hills, CA (US); Geoffrey P. McKnight, Los Angeles, CA (US); Janet M. Hogan, Mullica Hill, NJ (US); Joshua M. Montgomery, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/497,184

(22) Filed: Sep. 25, 2014

(65) Prior Publication Data

US 2015/0047923 A1     Feb. 19, 2015

Related U.S. Application Data

(63) Continuation of application No. 13/953,155, filed on Jul. 29, 2013, now Pat. No. 8,857,563.

(51) Int. Cl.
| | |
|---|---|
| *E04B 1/82* | (2006.01) |
| *H03H 9/25* | (2006.01) |
| *G10K 11/172* | (2006.01) |
| *B64C 1/40* | (2006.01) |
| *B60R 13/08* | (2006.01) |

(52) U.S. Cl.
CPC ............... *H03H 9/25* (2013.01); *G10K 11/172* (2013.01); *B60R 13/0815* (2013.01); *B64C 1/40* (2013.01)

(58) Field of Classification Search
CPC ................................ E04B 1/82; G10K 11/172
USPC ........................................................... 181/286
See application file for complete search history.

(56) References Cited

U.S. PATENT DOCUMENTS

| | | |
|---|---|---|
| 2,153,357 A | 4/1939 | Wente |
| 2,541,159 A | 2/1951 | Geiger |
| 2,796,636 A | 6/1957 | Heerwagen |
| 4,149,612 A | 4/1979 | Bschorr |
| 4,177,876 A | 12/1979 | Pujolle |
| 4,325,461 A | 4/1982 | Bschorr |
| 4,371,858 A | 2/1983 | Kanoi et al. |
| 4,442,419 A | 4/1984 | Kanoi et al. |
| 4,514,714 A | 4/1985 | Kanoi et al. |
| 5,521,341 A | 5/1996 | Stief et al. |

(Continued)

OTHER PUBLICATIONS

U.S. Appl. No. 14/497,198, filed Sep. 25, 2014, Montgomery et al.

(Continued)

*Primary Examiner* — Forrest M Phillips
(74) *Attorney, Agent, or Firm* — Baker & Hostetler LLP

(57) ABSTRACT

A hybrid acoustic absorption and reflection resonator can includes a rigid structure defining a cell, a membrane with at least one orifice attached to the rigid structure, and a back sheet attached to the rigid structure and covering the cell. The membrane is configured to reflect acoustic waves in a predetermined range of frequencies. The rigid structure, the membrane, and the back sheet define a Helmholtz cavity; the Helmholtz cavity is configured to absorb acoustic energy at a frequency within the predetermined range of frequencies.

21 Claims, 17 Drawing Sheets

(56) References Cited

U.S. PATENT DOCUMENTS

| | | |
|---|---|---|
| 5,587,564 A | 12/1996 | Stief et al. |
| 5,851,626 A | 12/1998 | McCorry et al. |
| 6,478,110 B1 | 11/2002 | Eatwell et al. |
| 6,792,907 B1 | 9/2004 | Kostun et al. |
| 7,249,653 B2 | 7/2007 | Sheng et al. |
| 7,263,028 B2 | 8/2007 | Thomas et al. |
| 7,395,898 B2 | 7/2008 | Yang et al. |
| 7,510,052 B2 | 3/2009 | Ayle |
| 8,011,472 B2 | 9/2011 | Tanase et al. |
| 8,360,201 B2 | 1/2013 | Tanase |
| 8,391,540 B2 | 3/2013 | Berriman et al. |
| 8,616,330 B1 | 12/2013 | McKnight et al. |
| 8,651,229 B2 | 2/2014 | Franzen |
| 8,857,563 B1 * | 10/2014 | Chang et al. ............ 181/286 |
| 2008/0099609 A1 | 5/2008 | Drost |
| 2008/0135327 A1 | 6/2008 | Matsumura et al. |
| 2009/0233045 A1 | 9/2009 | Slama et al. |
| 2010/0175949 A1 | 7/2010 | Yamaguchi et al. |
| 2010/0212999 A1 | 8/2010 | Marion et al. |
| 2013/0087407 A1 | 4/2013 | McKnight et al. |

OTHER PUBLICATIONS

Tang; "On Helmholtz resonators with tapered necks"; Journal of Sound and Vibration 279 (2005); 2003; p. 1085-1096.

Ingard et al.; "The Impedance of a Resistance Loaded Helmholtz Resonator"; The Journal of the Acoustic Society of America; vol. 25 No. 5; Sep. 1953; p. 854-857.

* cited by examiner

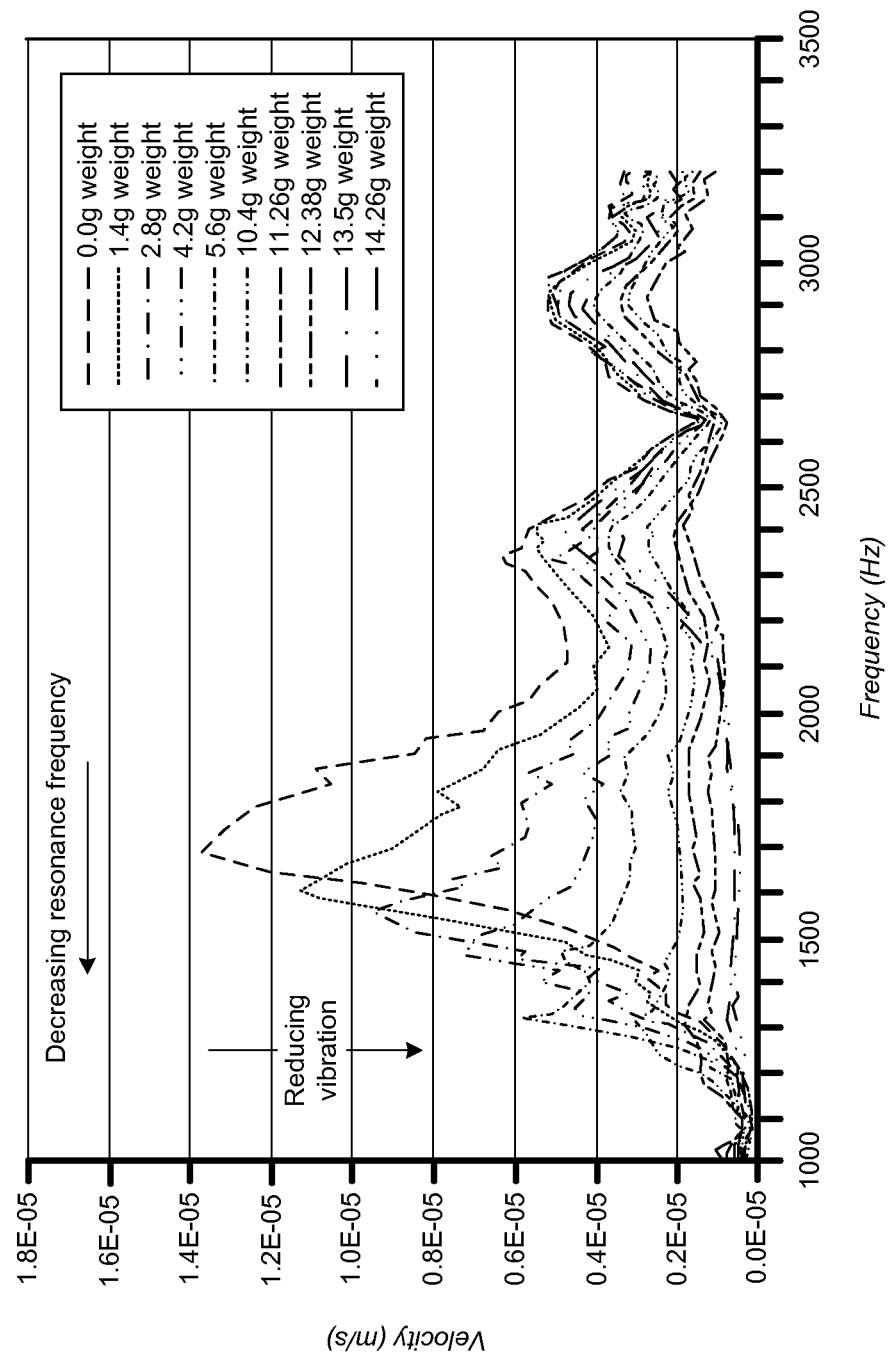

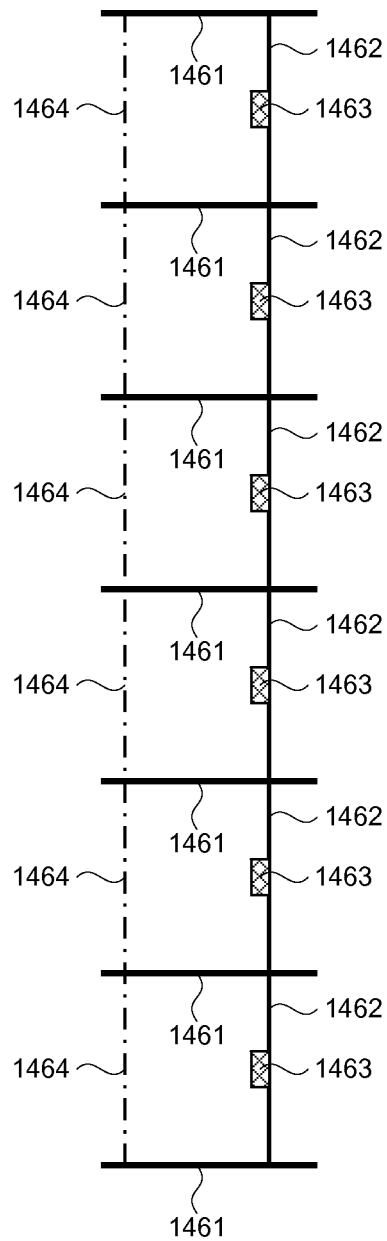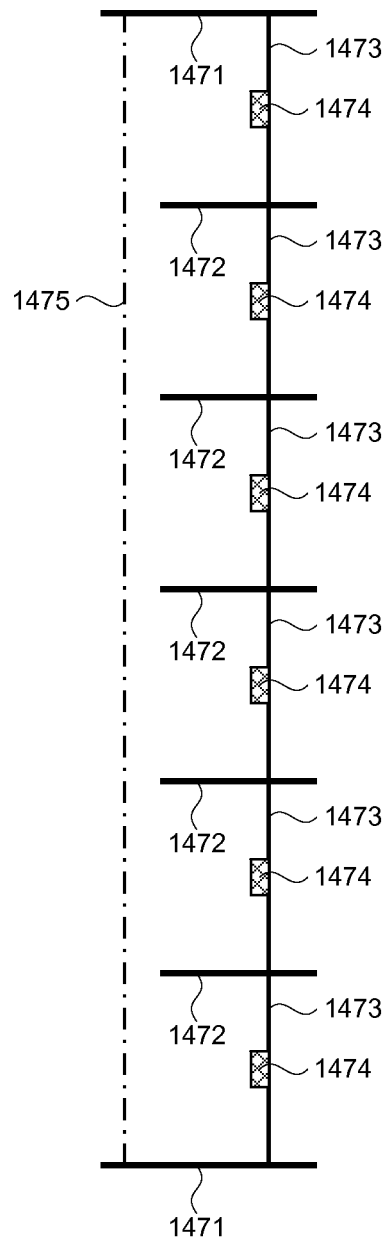
*Figure 14G*  *Figure 14H*

HYBRID ACOUSTIC BARRIER AND ABSORBER

CROSS REFERENCE TO RELATED APPLICATIONS

This application is a continuation of U.S. patent application Ser. No. 13/953,155, filed Jul. 29, 2013, now U.S. Pat. No. 8,857,563, issued Oct. 14, 2014, the contents of which are hereby incorporated by reference.

This application is related to U.S. application Ser. No. 13/952,995, entitled "Acoustic Barrier Support Structure," filed on Jul. 29, 2013, the contents of which are hereby incorporated by reference.

BACKGROUND

The present application is generally related to anti-resonant membranes, structures for holding such membranes, and hybrid reflective and absorbing housing defined by such anti-resonant membranes and supportive structures.

Noise can be harmful in a number of environments. Noise is widely recognized as harmful and a source of pollution as noise can be highly penetrating and disruptive. People can experience negative effects from noise, such as hearing loss, nausea, high blood pressure, increased stress, and the like. Sources of noise pollution can frequently be caused by machines, such as motor vehicles, aircraft, trains, generators, grinders, blenders, microwave ovens, sump pumps, and many other machines. Many of such machines can emit noise at relatively constant levels for long periods of time.

Various attempts have been made to provide noise reduction. Many noise shielding solutions are directly tied to the mass of a barrier. In general, noise transmission is governed by the mass density law, which states that the acoustic transmission T through a barrier is inversely proportional to the product of wall thickness, the mass density, and the sound frequency. Increasing the sound reduction characteristics of such a barrier can require increasing the thickness or mass density of the barrier, which adds weight and size to the barrier, especially in the low frequency range.

Other attempts have been made to improve noise reduction. For example, U.S. Published Patent Application 2013/0087407 describes a tunable, high-bandwidth, anti-resonant membrane with a weight disposed in a center portion of the membrane. U.S. Published Patent Application 2010/0212999 is related to conventional Helmholtz resonators with at least one membrane wall for the resonating housing. However, the resonance of the membrane wall(s) does not include noise reflecting capabilities. U.S. Pat. No. 7,510,052 discloses a sound cancellation honeycomb based on modified Helmholtz resonance effect. However, the honeycomb based solution in U.S. Pat. No. 7,510,052 does not include noise reflecting capabilities. U.S. Published Patent Application 2008/0099609 discloses a tunable acoustic absorption system for an aircraft cabin that is tuned by selecting different materials and changing dimensions to achieve soundproofing for each position and specific aircraft. Although it describes the integration details of conventional barriers and absorbers, the structures disclosed in U.S. Application 2008/0099609 are heavy and bulky. U.S. Pat. No. 7,263,028 discloses embedding a plurality of particles with various characteristic acoustic impedances in a sandwich with other lightweight panels to enhance the sound isolation. Although it could be lighter or thinner than traditional solid soundproofing panels, it is still bulky and its soundproofing operating frequency is high, which makes it less effective for low-frequency operation.

U.S. Pat. No. 7,249,653 discloses acoustic attenuation materials that comprise an outer layer of a stiff material that sandwiches other elastic soft panels with an integrated mass located on the soft panels. By using the mechanical resonance, the panel passively absorbs the incident sound wave to attenuate noise. The panel has a 100 Hz bandwidth centered around 175 Hz and is not easily tailored to various environmental conditions. U.S. Pat. Nos. 4,149,612 and 4,325,461 disclose silators. A silator is an evacuated lentiform (double convex lens shape) with a convex cap of sheet metal. These silators comprise a compliant plate with an enclosed volume wherein the pressure is lower than atmospheric pressure to constitute a vibrating system for reducing noise. To control the operating frequency, the pressure enclosed in the volume coupled with the structural configuration determines the blocking noise frequency. The operating frequency dependence on the pressure in the enclosed volume makes the operating frequency dependent on environment changes such as temperature. U.S. Pat. No. 5,851,626 discloses a vehicle acoustic damping and decoupling system. This system includes a bubble pack which may be filled with various damping liquids and air to enable the acoustic damping. It is a passive damping system dependent on the environment. U.S. Pat. No. 7,395,898 discloses an anti-resonant cellular panel array based on flexible rubbery membranes stretched across a rigid frame. However, the structures disclosed in U.S. Pat. No. 7,395,898 do not consider the vibration effects of the supportive frame which significantly affect anti-resonance of each cell in terms of frequency and effectiveness. Furthermore, the whole panel structure becomes an efficient sound transmission path especially at the resonance frequencies. The overall effects due to both the cell and frame dynamics could significantly affect the panel's acoustic behavior and counteract its noise insulation performance. This is particularly important in large-scale, lightweight, and compact acoustic barrier design.

SUMMARY

Illustrative embodiments of the present invention include, without limitation, a methods, structures, and systems. In one aspect, a hybrid acoustic absorption and reflection resonator includes a rigid structure defining a cell, a membrane with at least one orifice and at least one weight attached to the rigid structure, and a back sheet attached to the rigid structure and covering the cell. The membrane is configured to reflect acoustic waves in a predetermined range of frequencies. The rigid structure, the membrane, and the back sheet define a Helmholtz cavity; the Helmholtz cavity is configured to absorb acoustic energy at a frequency within the predetermined range of frequencies.

In one embodiment, the membrane is configured to reflect acoustic waves at an anti-resonance frequency. In another embodiment, the membrane comprises a plurality of orifices. In one embodiment, the membrane has a plurality of orifices. Any of the orifices can be covered by a plurality of perforations where each of the perforations is smaller in size than the orifice. In another embodiment, the back sheet can be a second membrane. The second membrane can be configured to reflect acoustic waves in the predetermined range of frequencies with or without an added weight. In another embodiment, the back sheet can be a structural sheet or a plate.

In another embodiment, the membrane comprises a weight. The weight can surround the orifice and define a neck length of the orifice. In one example, the weight can be a ring that has at least one circular through orifice. In other examples, the orifice can be in the shape of a triangle, a rectangle, a square, or any other shape. The weight can have a tapered shape through its thickness. In another embodiment, the weight does not define the orifice and the neck length and area size of the orifice on the membrane is defined by a lightweight tube which does not affect the tuning reflection frequency of the membrane. For both embodiments, the added weight on the membrane with at least one orifice can be used to tune the absorption frequency of Helmholtz resonator.

In another embodiment, the hybrid resonator can include at least one absorbent material located between the membrane and the back sheet. The absorbent material can comprise a porous and fibrous material. The absorbent material can also comprise at least one septum layer. The absorbent material can be located such that a small air gap exists between the membrane and the absorbent material.

In another aspect, an array of hybrid resonators can include a rigid structure defining an array of cells and a plurality of hybrid resonators. Each of the plurality of hybrid resonators can be located in one of the cells. Each of the plurality of hybrid resonators can include a membrane attached to the rigid structure and a back sheet attached to the rigid structure and covering the cell. The membrane can comprise at least one orifice. The membrane with an attached weight can be configured to reflect acoustic waves in a predetermined range of frequencies. The rigid structure, the membrane, and the back sheet can define a Helmholtz cavity. In one embodiment, the hybrid resonators in the plurality of hybrid resonators can be configured to reflect acoustic waves within the same predetermined range of frequencies. Ones of the plurality of hybrid resonators can be configured to absorb acoustic energy at different frequencies within the predetermined range of frequencies. The Helmholtz cavities of the ones of the plurality of hybrid resonators can have substantially the same size, and the ones of the plurality of hybrid resonators can be configured to absorb acoustic energy at different frequencies. Absorption at the different frequencies can occur based on an absorbent material being located at different locations within the Helmholtz cavities of the ones of the plurality of hybrid resonators.

Other features of the inventive system and method are described below. The features, functions, and advantages can be achieved independently in various embodiments or may be combined in yet other embodiments, further details of which can be seen with reference to the following description and drawings.

BRIEF DESCRIPTION OF THE DRAWINGS

Throughout the drawings, reference numbers may be re-used to indicate correspondence between referenced elements. The drawings are provided to illustrate examples described herein and are not intended to limit the scope of the disclosure.

FIG. 7 depicts a graph of the velocity spectrum at the center of the support structure with different added structure central masses.

FIGS. 14A-14H depict various examples of possible configurations for membrane-type hybrid Helmholtz resonators.

DETAILED DESCRIPTION

Existing methods for noise reduction and control rely on either mass to deaden sound transmission through momentum exchange or active solutions that use energy and transducers to create cancelling waves out of phase with the incident energy. Acoustic foams and fibers, and blankets are traditionally used as acoustic absorbers, and acoustic blankets are traditionally used as acoustic barriers. For low frequency ranges, these materials may need to be extremely thick in order to mitigate the sound, leading to very heavy and bulky structures.

The sound reduction qualities of the structure can be improved by adding mass throughout the structure. However, many noise environments do not allow for heavy structures. Lightweight, compact, and scalable structure noise barriers could be beneficial in a broad range of environments. For example, commercial and military aircraft and rotorcraft could benefit from damping or blocking of acoustic energy from engines, electronic devices, and other noise sources with tonal noise, particularly on manned aircraft. Acoustic isolation in the form of a lightweight barrier could be used in aircraft, rotorcraft, and vehicle interiors for floors, ceilings, walls, lavatories, cargo hold liners, and many other situations.

Due to higher demands on fuel economy, carbon fiber composites are increasingly being used as structural materials in vehicles due to their light weight and high stiffness. These materials are effective sounds transmitters and degrade the noise floor performance of vehicles. In the past, ultralight structures, such as those in the range of 20 to 70 ounces per square yard, and rigid structures were thought too poor for reduction acoustic transmission since they are efficient radiators.

Moreover, conventional noise control relies on either sound absorption or reflection to reduce noise level. In absorbers, such as porous materials, sound propagation occurs in a network of interconnected pores in such a way that viscous and thermal effects cause acoustic energy to be dissipated. The energy dissipation needs air molecules propagating through the interconnected tunnels; therefore, a wavelength thick absorptive material is usually needed to have effective absorption. As for sound reflective barriers, noise blocking usually follows the mass law prediction which dictates that higher noise reduction occurs with increasing mass and as frequency increases. However, low frequency noise with long wavelengths, which typically is very difficult to defeat with traditional methods, consequently becomes a challenge for noise control engineering especially for lightweight design of modern energy-efficient vehicles. There is no conventional solution for a lightweight, compact approach with combined absorption and reflection capability for low frequency noise control.

Figure 1:
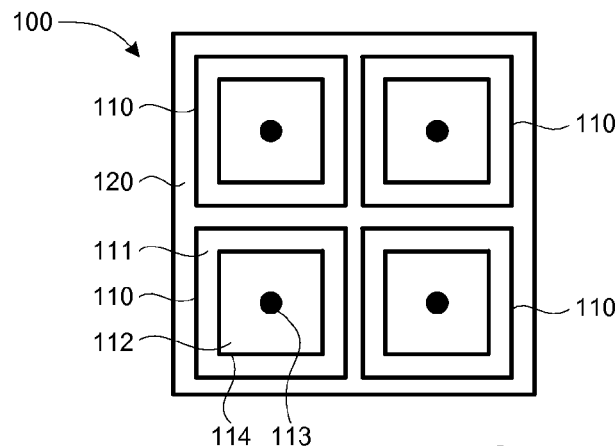
FIG. 1 depicts an example of an array of resonant membranes attached to a frame.

Depicted in FIG. 1 is an example of an array 100 of resonant membranes 110 attached to a frame 120. Each of the resonant membranes 110 can have a first membrane 111 and a second membrane 112. A weight 113 can be attached to the second membrane 112. The weight can be attached at or near the center of the second membrane 112. The membranes depicted in FIG. 1 are generally square in shape, but other shapes are possible, such as circles, rectangles, triangles, hexagons, and the like. In one example, the first membrane 111 and the second membrane 112 comprise the same material(s) and/or thickness. In another example, the first membrane 111 and the second membrane 112 comprise the same material(s). In another example the first membrane 111 and the second membrane 112 may be attached via a hinge 114. A hinge 114 may allow a designer to decouple the response of the frame 120 from the system tension in membranes 111 and 112, and allow the use of stiff, creep resistant materials for the membranes 111 and 112.

In one example, the hinge 114 is a bend dominated elastic component built into the surface of the membranes 111 and 112 that creates a method to tune the stiffness and hence resonant frequency of the membrane structure without using tension. The stiffness of the hinge 114 is controlled by the length and thickness parameters of the hinge 114, which can be thought of as, for example, a curved plate. Thus the stiffness is based on the elastic modulus, the Poisson ratio, and the thickness of the material(s) forming the hinge 114. The thickness of the membrane can be between about 0.001 inches and about 0.005 inches. In typical membranes, the tension component provides all bending resistance and thus defines the properties, independent of material selected. By tuning the thickness and height/width ratio of the hinge 114, the stiffness of the resonant membranes 110 may be tuned. With the ability to adjust the stiffness of the resonant membranes 110, the resonant membranes 110 may have a very low frequency response by using stiff materials such as engineering thermoplastics and/or thermosets for the membranes 111 and 112. These thermoplastics and thermosets exhibit very low creep that would change the behavior and performance and have great temperature stability advantageous for many engineering applications. In certain examples, membranes 111 and 112 may comprise Acrylonitrile butadiene styrene (ABS), Polycarbonates (PC), Polyamides (PA), Polybutylene terephthalate (PBT), Polyethylene terephthalate (PET), Polyphenylene oxide (PPO), Polysulphone (PSU), Polyetherketone (PEK), Polyetheretherketone (PEEK), Polyimides Polyphenylene sulfide (PPS), Polyoxymethylene plastic (POM), HDPE, LDPE, or nylon. It is to be understood that other materials may also be used for the membranes 111 and 112. Without implying a limitation, membranes 111 and 112 may also comprise metals such as aluminum, brass and steel.

In certain examples, the weights 113 may comprise iron alloys, brass alloys, aluminum, lead, ceramics, glass, stone, or other materials. In other examples, the weights 113 may be shaped as a cylinder, cube or rectangular solid. To increase the size of the mass without influencing the length of the membrane, and without implying a limitation, the weights 113 may be in the form of a T shape, ring shape or irregular shapes depending on the desired requirements. The mass could couple to support structures with connecting materials, such as shape memory alloys or viscoelastic materials, to harness membrane properties such as tension, damping and local stiffness to tailor resonating dynamics, suppress unwanted resonating modes and increase noise control performance.

In the example depicted in FIG. 1, resonant membranes 110 are held within a single membrane array 100. The particular single membrane array 100 depicted in FIG. 1 comprises four resonant membranes 110, each with membranes 111 and 112, weights 113, and hinges 114. Many other variations of arrays are possible, including variations on the overall shape of the array 100, variations on the shapes of the individual resonant membranes 110, variations on the number resonant membranes 110, and the like.

Figure 2:
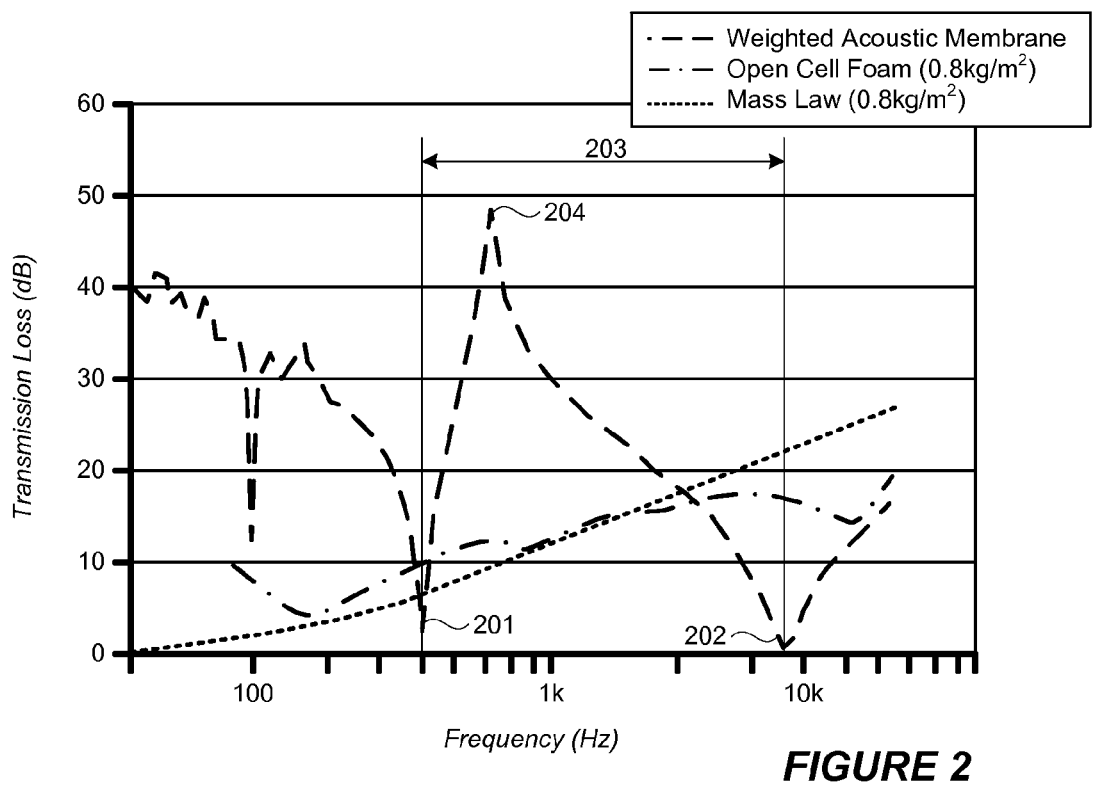
FIG. 2 depicts a stop band filter effect for a single weighted acoustic membrane.

FIG. 2 depicts a stop band filter effect for a single weighted acoustic membrane, such as the array 100 shown in FIG. 1, showing a large decrease in transmission over a particular active band compared to traditional foam or rubber mat acoustic barrier materials. When properly tuned by selection of tension, stiffness, and added weight, a membrane can create an effective barrier to acoustic energy through the principal of negative mass. In a resonant system such as a weighted membrane, there are two fundamental resonant peaks 201 and 202 for the mass at peak displacement and for the middle of the membrane between added weight and attached edges at peak displacement. Between these two fundamental resonant peaks 201 and 202, a negative mass regime 203 exists where the membrane mode shape displacement is a combination of these two modes. At an antinode 204 in the negative mass regime 203, the membrane acceleration becomes out of phase with the pressure gradient across the membrane and further the combination of the two modes results in a nearly zero displacement in the membrane. This phase difference and effective steadiness are analogous to a rigid wall and create a significant loss in transmission across the membrane across a particular band. As seen in FIG. 2, at the antinode 204 frequency the transmission loss can be more than 30 dB above a material such as an open cell foam of comparable surface density. This effect can be particularly useful at low frequencies where traditional barriers and absorbers perform poorly.

Figure 3:
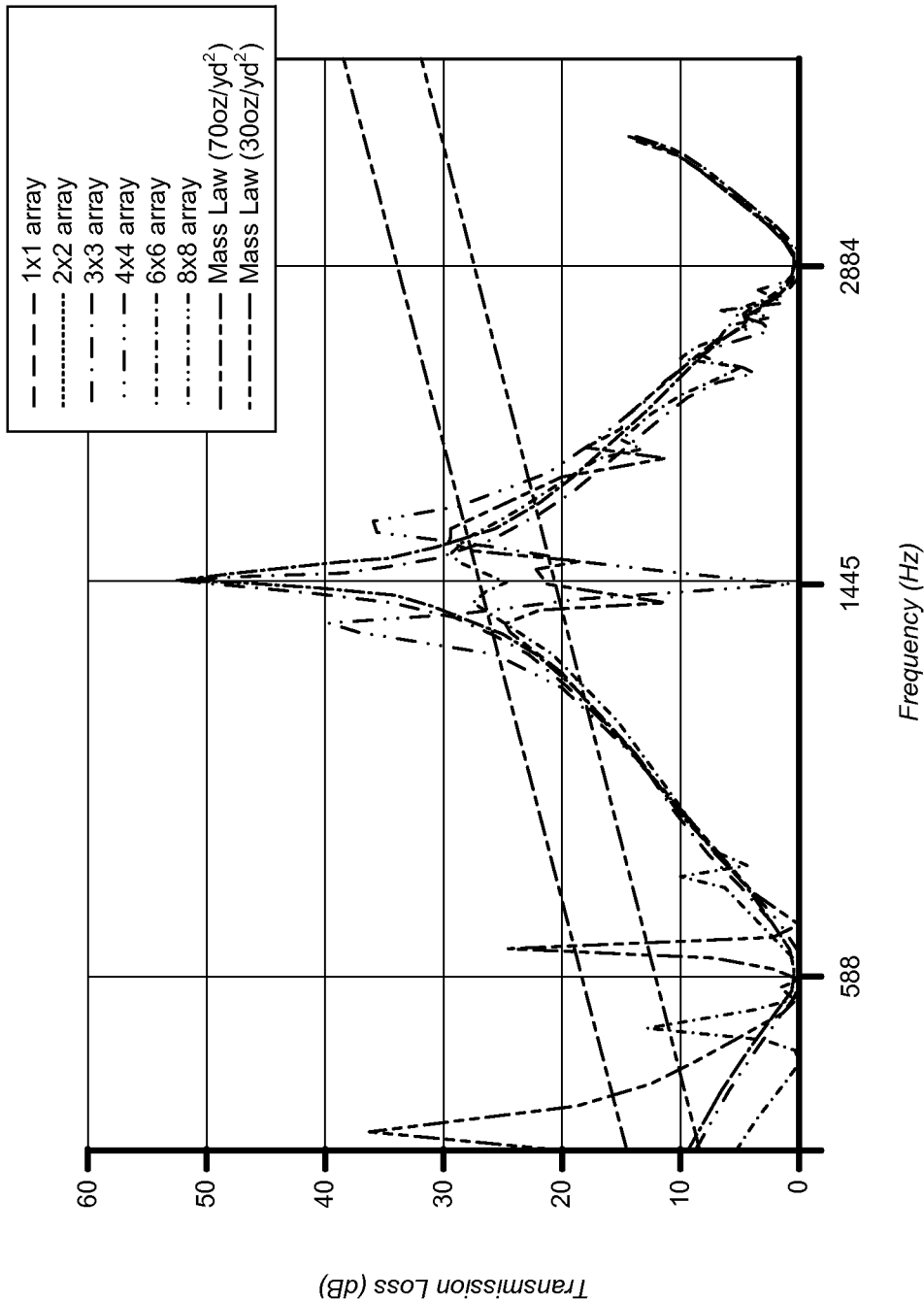
FIG. 3 depicts performances of various array sizes of membranes as compared to a single membrane showing clear resonant behavior and decreased transmission loss with increasing array size.

A single membrane can be assembled into arrays of membranes with the goal to provide similar performance to the single membrane. This allows for scaling the membranes to cover large areas that are desirable for protecting user compartments in vehicles such as cars, trucks, aircraft, and rotorcraft. FIG. 3 depicts performances of various arrays of membranes as compared to a single membrane showing clear structural resonances and decreased transmission loss with increasing size. The one transmission peak results from a combined mode of several membranes which can be controlled through design. The performances depicted in FIG. 3 show an intended stop pass acoustic filter characteristics around a frequency of 1445 Hz. While some of the arrays— such as the 1×1 array, the 2×2 array, and the 3×3 array—show peak acoustic transmission loss around 1445 Hz, others of the arrays—such as the 4×4 array, the 6×6 array, and the 8×8 array—have much lower transmission loss around 1445 Hz. In particular, the 4×4 array splits the transmission loss peak into two sub-peaks. The resonances of the structure holding the membranes in the arrays degrade the transmission loss performance with increasing size.

Figure 4:
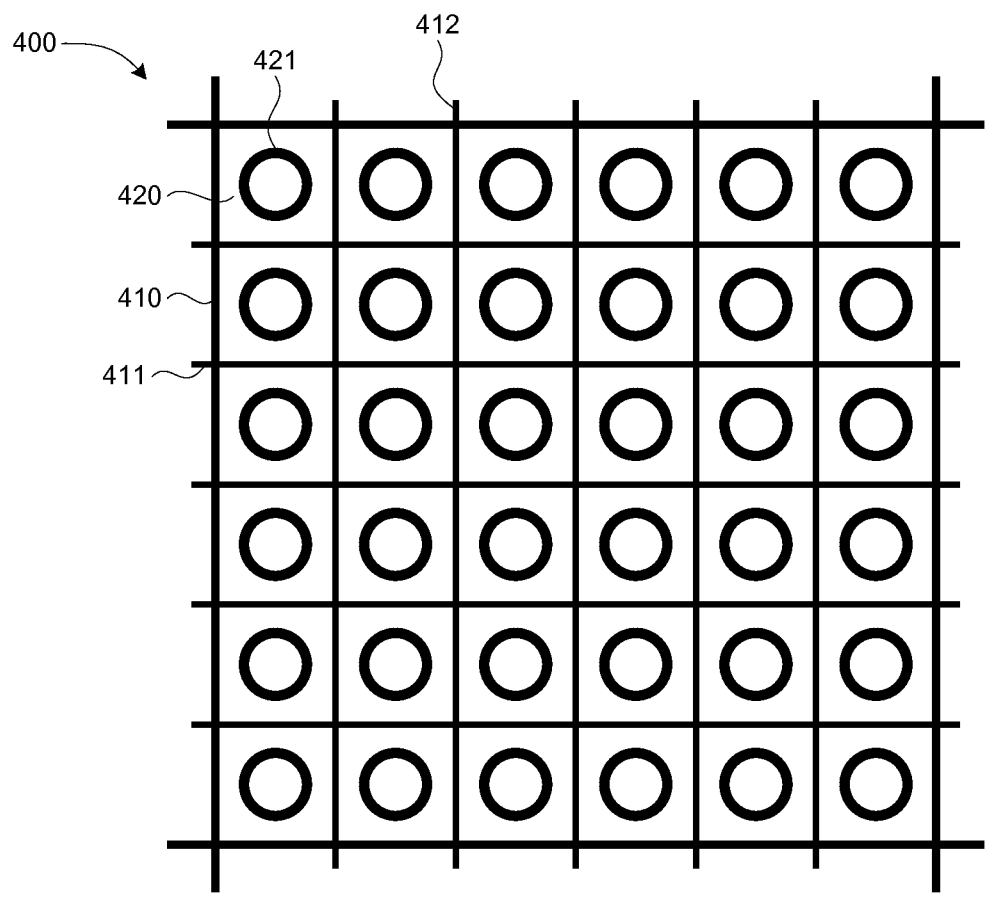
FIG. 4 depicts an example of an array including a grid structure and a number of integrated membranes.

FIG. 4 depicts an example of an array 400 including structure of a grid 410 and a number of integrated membranes 420. In the example depicted in FIG. 4, the grid 410 can include a number of horizontal structural members 411 and a number of vertical structural members 412. The terms "vertical" structural members and "horizontal" structural members are used for convenience and clarity, even though such structures may be aligned in any orientation. The grid 410 defines a number of cells for each of the membranes 420 to be located. In another example, the grid 410 can be made of carbon fiber composites. Each cell in the grid 410 can have at least one of the integrated membranes 420 located over the cell. The membranes can also include a central mass 421 to permit tuning and reducing the resonant frequency range. To control the dynamics and vibration of the integrated membranes 420, the width and height of the sides in an individual cell in grid 410 may be less than 100 mm. To create barriers across large areas using smaller cells, an array or arrays of cells can be used. In one example, the exterior horizontal and vertical structural members of the array 400 have a thickness that is at least twice the thickness of the interior horizontal and vertical structural members.

In the previous solutions, such as those discussed in U.S. Pat. No. 7,395,898, the support structure is described as acoustically transparent, implying that the support structure does not contribute to the acoustic behavior of the membrane. However, when viewing the results of the performances of the arrays depicted in FIG. 3, it appears that the support structure does indeed contribute to the acoustic behavior of the membrane. Various examples of support structures are disclosed herein for use as support structures with integrated tuned membranes that can create high performance acoustic barriers at minimum weight.

In one example, a support structure can be created with a fundamental resonant frequency at least 10% above a target isolation frequency range. In another example, a hierarchical support structure can be created with a high fundamental frequency with tailored solutions such as central-slotted, non-planar, and stiffened structural grid which is subsequently tuned using a central mass to establish a band gap between odd resonance modes and control its vibration behavior over a prescribed range of frequencies. The central mass of the support structure and membrane masses can be selected so that the odd resonance nodes of the support structure and the odd resonance modes of the membranes are within a predetermined range of frequencies. These examples allow the acoustic transmission properties of the support structure to be similar to the acoustic transmission properties of the individual cell membranes. When both the structure and the cell membranes operate with similar acoustic transmission properties, the result is an overall lightweight structure with a very high acoustic isolation performance. These approaches significantly expand the performance of membranes in terms of the mass of the system and the total insertion loss achievable. By optimizing the design of the system at multiple length scales, a lightweight acoustic barrier with sound reduction greater than 50 dB can be achieved. Additionally, the optimized support structure combined with the membrane array allows a number of configurations such that broadband frequency can be covered.

Support structures can be made of various materials. For example, support structures can be made from carbon or glass fiber polymer composite material. Other composites may be used depending on the environmental thermal or chemical conditions. These could include ceramic or metal matrix composites. In one example, a support structure composite can include 3-ply 0-90-0 layup unidirectional fibers. Such a material can provides a desired stiffness and mass properties with a minimum of mass. In one example, a desired range of thickness for the walls of the support structure is between about 0.01 inches and about 0.035 inches. To improve the bonding of the membrane as well as lateral and torsional stability of the tile, the edges of the array may use additional plies of 0-90-0 composite. In some examples, such additional layers can result in between 8 and 12 plies. The height of the structure can be specified such that the fundamental frequency in the applied boundary conditions (typically pinned conditions) is at least 10% above the intended use conditions. Determining this dimension can be done using finite element modeling, modified beam/plate theory, or any other method.

Support structures can be fabricated using a variety of methods. In one example, an interlocking grid approach is possible where the individual members are cut into strips with matching slots allowing a wine crate type of construction to form shaped cells. The shaped cells can be in the form of triangles, squares, rectangles, hexagons, and any other shape. Once in place, high stiffness adhesives, such as ceramic or glass filled epoxy adhesives, can maintain stiffness between members despite the slots in the frame members. In another example, support structures can be constructed of strips of materials that have been cured in mold to create a wave pattern. These patterned plates can then be trimmed and bonded using a secondary process to create shaped cells. Such shaped cells can be in the form of triangles, squares, rectangles, hexagons, and any other shape. These methods may afford greater scalability in manufacturing because large assemblies can be created simultaneously and then cut using a saw to the desired thickness, thus reducing the number of curing and bonding steps.

While composite materials provide the highest performance in weight, the disclosed method for hierarchical acoustic barriers is not limited to composite material support structure. Metal alloys can also be assembled with bending and joining operations. Joining operations could be adhesive or welding and brazing based. Additionally, while support structures may easily be formed into square and rectangle cells, other forms and shapes are possible. For example, a support structure may be formed in honeycomb shape to permit the use of hexagonal membranes.

In one particular example, a Toray® M40J carbon fiber prepreg material can be used due to its high fiber modulus and resulting high composite stiffness. The layup is cured and debulked in a hot press according to specifications. A grid perimeter can fabricated with 13 plies of the same prepreg material. This can increase perimeter thickness to prevent non-uniform membrane tension as well as increase the overall grid resonance frequency by effectively increasing the overall stiffness of the support structure. Grids can be machined with slits, interlocked, and glued together with a high strength epoxy. The height of the support structure can be determined by the resonant frequency of the structure, such that the resonance occurs away from the target frequency. The resulting support structure is extremely lightweight with high stiffness at a relatively low cost, which is not achievable with conventional monolithic materials.

Figure 6:
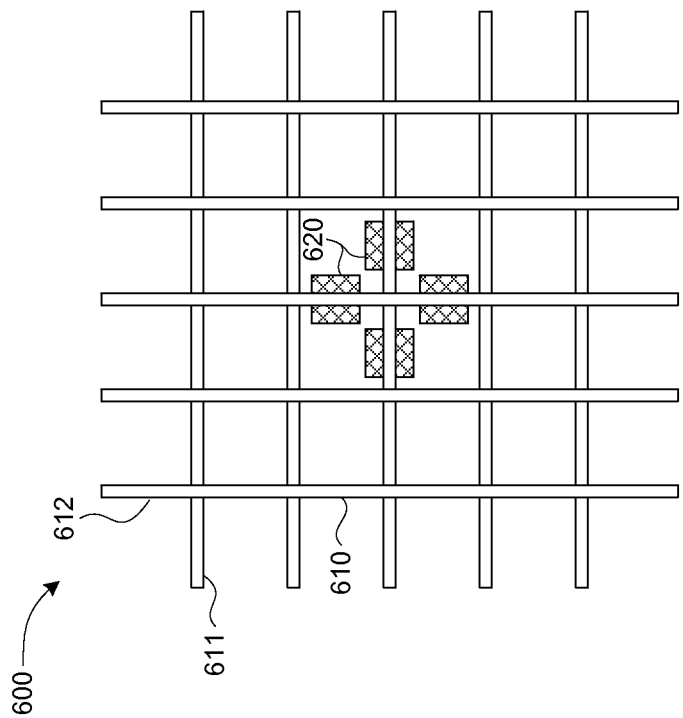
FIGS. 5 and 6 depict examples of hierarchical designs with grids and centrally added structure weights.
Figure 5:
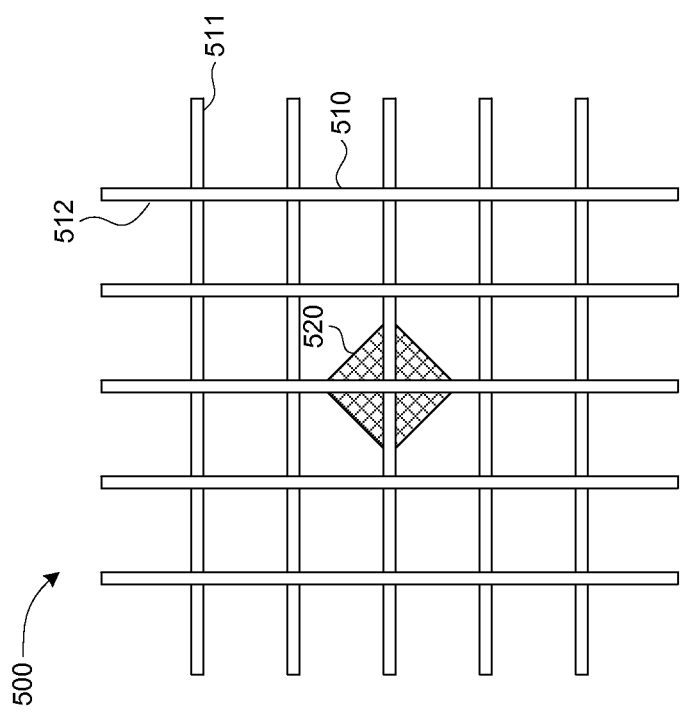

When the grid structure alone does not provide at least a 10% higher (0,1) mode resonance frequency than the target frequency to obtain acoustic transmission loss performance; a hierarchical structure can be created by adding concentrated mass to the lightweight support structure. FIGS. 5 and 6 depict examples of hierarchical designs with grids and added structure central weights to create frequency band gap between structure odd modes and suppress the structure-membrane coupled modes. In the example depicted in FIG. 5, a support structure 500 is depicted with a grid 510 and an added weight 520. The grid 510 includes a number of horizontal members 511 and a number of vertical members 512. The added weight 520 can be constructed of any material. Dense alloys, such as alloys that include one or more of steel, stainless steel, and Tungsten, may provide sufficient weight without significantly increasing the size of the support structure 500 such that the highest performance of the added weight is near the modeshape peak amplitude.

The hierarchical design and subsequent improved acoustic response can be obtained by placing the added weight 520 in the support structure. In this manner, the added weight 520 performs a function similar to the weight added to the membranes in the individual cells. To achieve synergistic effects it is necessary for the support structure 500 to have odd mode resonance frequencies away from the desired acoustic isolation frequency range of the individual cells. The even modes generally form acoustic dipoles which self-compensate the sound radiation and have limited influence on the noise isolation. The resident modal frequencies of the support structure 500 can be tuned by selecting an appropriate size of the added weight 520, mass of the added weight 520, and/or location for the added weight 520 on the support structure 500. The added weight 520 can be placed near the peak displacement of the odd resonant modes. For instance, the added weight 520 in FIGS. 5 can effective for establishing a band gap between the (0,1) and (0,3) modes by moving the (0,1) mode to lower frequency and keeping the (0,3) mode frequency relatively steady. In addition, the mass inertia suppresses the structure-membrane coupled modes while reduction the vibration magnitude of mode shapes which further improves the transmission loss of the acoustic panel.

The added weight 520 itself can be incorporated to the grid 510 in a variety of methods. In one example, the size and shape of the added weight 520 can be selected to maintain a minimal profile for the support structure 500. The added weight 520 can be joined to the grid support structure 500 as an insert with a cross shaped slot that mates to the grid support structure 500.

In the example depicted in FIG. 6, a support structure 600 is depicted with a grid 610 and added weights 620. The grid 610 includes a number of horizontal members 611 and a number of vertical members 612. As shown, multiple weights 620 can be added near the displacement peaks of odd modes to create the hierarchical structure which has sufficient frequency band gap between odd modes and suppressed vibration near the target noise isolation frequency range. Each of the added weights can be joined to the grid 610 along one or more of the horizontal members 611 and one or more of the vertical members 612.

The effects of a support grid with a central added weight on shifting the fundamental panel resonance combined with suppressing the vibration of the panel are shown in FIG. 7. More specifically, FIG. 7 depicts a graph of the velocity spectrum at the center of the support structure with uniform white noise acoustic excitation. Without added weight, the support structure undergoes principal resonance at about 1750 Hz. In this particular example, the desired frequency for blocking noise transmission was a band centered on 1500 Hz. By adding increasing larger masses, the fundamental mode is driven below 1200 Hz and simultaneously decreased in amplitude. This is caused by the significant increase in moment of inertia of the fundamental mode. An anti-resonance peak appears above the fundamental mode, further decreasing velocity and increasing transmission loss. This approach is enabled by creating a very lightweight, very stiff support structure that then can be dramatically tuned using small additions of weight in particular locations. For the results shown in FIG. 7, the largest mass added to the support structure was approximately 33% of the mass of the support structure. Depending on the particular acoustic properties desired, the added mass may vary in a range between about 10% and about 50% of the mass of the support structure.

Figure 8:
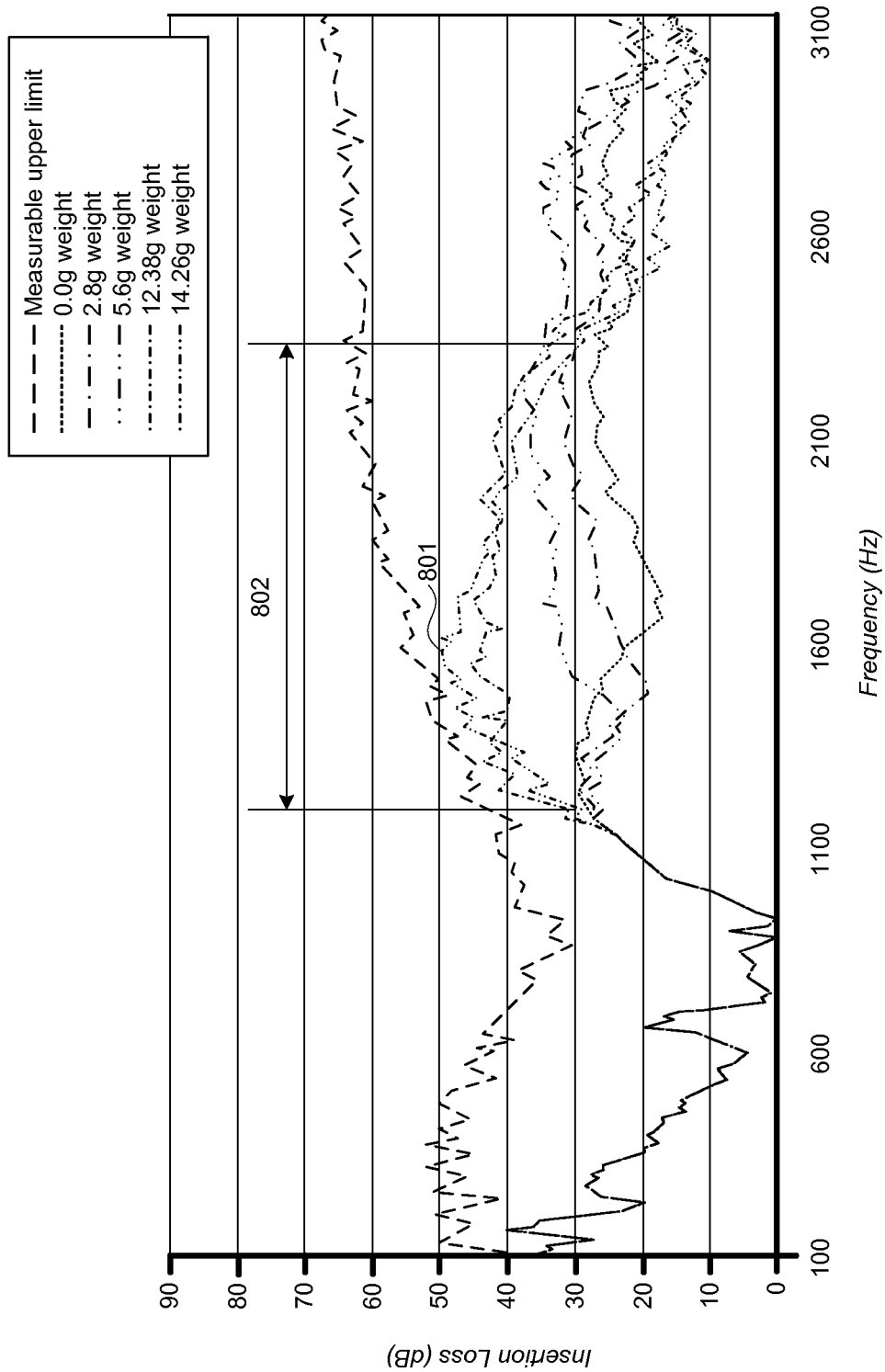
FIG. 8 depicts a graph of the insertion loss of a 6×6 large scale acoustic barrier with 240 mm×240 mm dimension as a function of frequency for various central-weighted support structures.

FIG. 8 depicts a graph of the insertion loss of a support grid with a central added weight as a function of frequency for various weighted acoustic barrier support structures. As depicted, a maximum insertion loss 801 of about 50 dB could be achieved with about a 1200 Hz bandwidth 802 above the 30 dB level. Due to the tailored support structure around a specified target frequency of 1500 Hz, a lightweight acoustic tile (64 oz/yd$^2$) was achieved with a maximum insertion loss of about 50 dB. At resonance, in either the membrane or the grid support structure, the vibration is the highest. Increases in vibration lead to increases in transmission across the barrier. By reducing the resonant frequency of the support structure to around that of the membrane resonance, both resonances occur at about the same frequency and therefore the resonance effect on noise transmission is at a minimum. This convergence of the support structure properties and membrane properties creates very high acoustic transmission loss per unit weight.

In contrast to conventional thinking, lightweight structural materials that house tuned membranes can also exhibit good acoustic-reduction characteristics if properly designed and tuned and to complement the tuned membranes. When tuned, the structures can provide very effective transmission loss at specified frequency bands. In certain examples, the resonance performance and vibration characteristics of a lightweight and stiff structural support can be tuned using one or more central masses added to the structure. The tuning of the membranes and the support structure can be optimized to produce a lightweight acoustic barrier support structure for noise mitigation.

In one example of making a resonant membrane structure, resonant membranes can be designed to provide effective sound rejection at particular frequencies by tuning and selecting appropriate materials. A support structure for the resonant membranes can be designed with a lightweight grid and a center weight to mimic the sound rejection of the resonant membranes at the particular frequencies. Once designed, the support structure can be formed of a lightweight material, such as thin interlocking carbon fiber composite grids that provide a lightweight, high stiffness solution. The resonant membranes can be formed and placed in individual cells of the support structure. The full resonant membrane structure, including the support structure and the resonant membranes, exhibits cooperative anti-resonant behavior to reject noise around the particular frequencies. Such a resonant membrane structure can reject acoustic energy over a specified frequency ranges at one-fourth to one-tenth of mass per unit area of traditional acoustic barrier solutions.

Figure 9A:
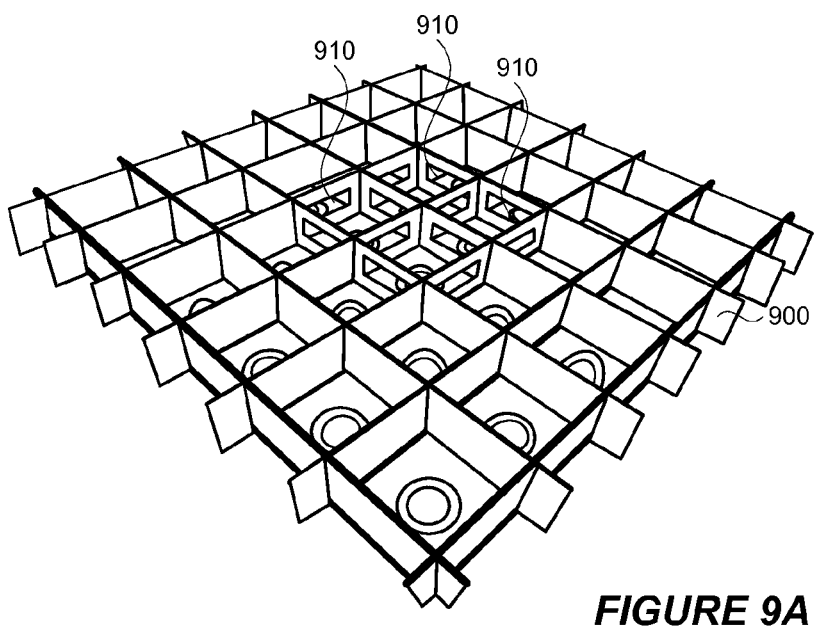
FIGS. 9A-9C depict examples of support structures with material removed from certain portions of the support structure.

Support structures can be improved by reducing material from certain portions of the support structure. As shown in FIG. 9A, material can be removed from the central portion of grid structure 900 by including slots 910 in portions of the grid. In the particular example shown in FIG. 9A, the slots 910 are limited to the center 2×2 cell region of the grid structure 900. Including slots 910 in the grid structure 900 can increase the resonant frequency of the grid structure 900 alone while simultaneously reducing overall mass of the grid structure 900. Placing slots in other portions of the grid structure 900 (i.e., outside of the center area) could adversely affect the acoustic performance and structural integrity of the grid structure 900. Even when slots 910 are included in grid structure 900, proper tuning of the acoustic properties of the grid structure 900 could include attaching a center mass to the grid structure. Adding a central mass to the grid structure 900 while also including slots 910 in the grid structure to remove mass from the grid structure may seem counterproductive; however, the slots 910 and the added central mass can result in a very higher performance for acoustic loss per unit mass.

Figure 9B:
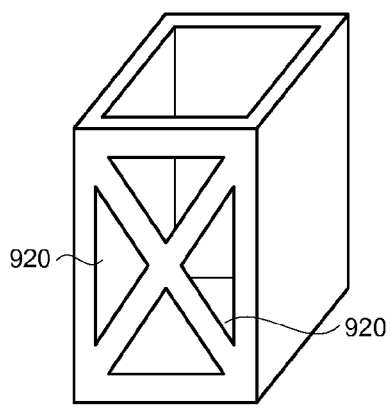
Figure 9C:
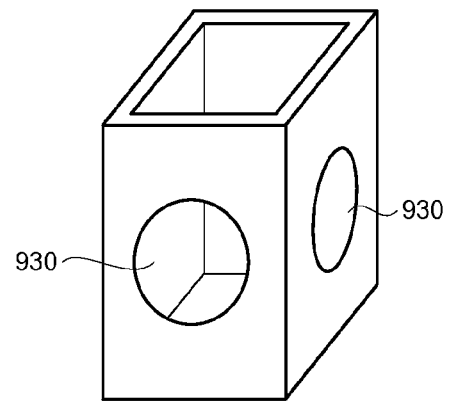

Slots cut into the sides of a grid structure can take a number of forms. In FIG. 9A, the slots 910 in grid structure 900 are rectangular in formation. FIG. 9B depicts triangular slots 920 that could also be used in a grid structure. FIG. 9C depicts circular slots 930 that could also be used. Any other shape of slots could also be used to reduce mass of the grid structure. In FIG. 9A, the rectangular cutout section depicted was selected because it exhibited an increase in fundamental resonant frequency of about 20%.

Figure 10A:
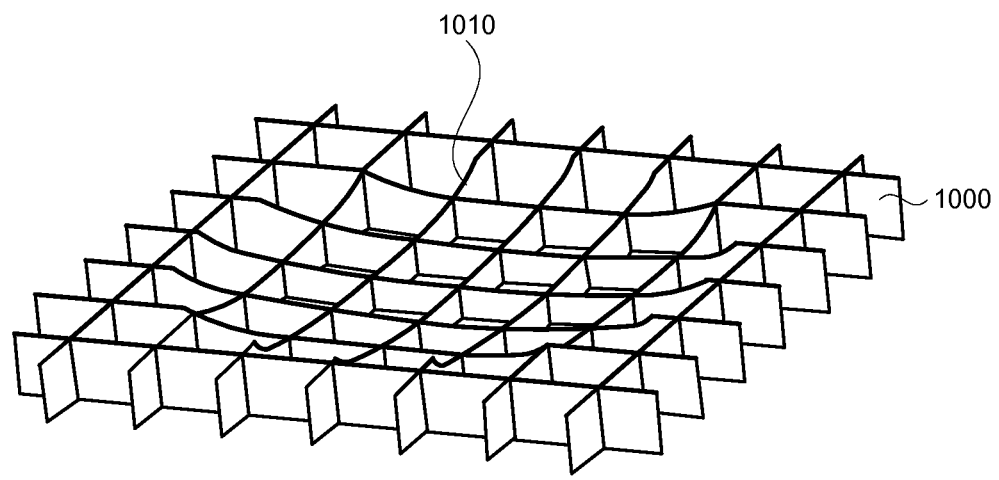
FIGS. 10A-10B depict examples of support structures with material removed from a grid support structure to create a non-planar membrane support structure.
Figure 10B:
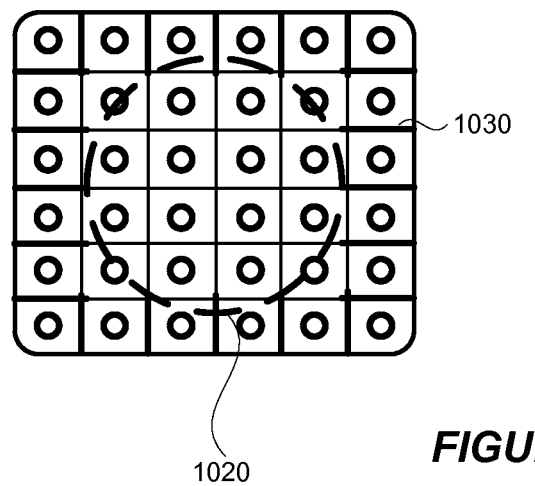

In other examples, mass can be removed from a grid support structure to create a non-planar membrane support structure. FIG. 10A depicts a grid structure 1000 with a flat face on the bottom of the grid structure 1000 and a curved (i.e., non-planar) face 1010 on the top of the grid structure 1000. Resonant membranes can be attached to the flat bottom of the grid structure 1000 while the non-planar face 1010 on the top of the grid structure 1000 removes mass from the overall grid structure 1000. The non-planar face 1010 can remove more of the mass from the center of the grid structure 1000 than from the edges of the grid structure 1000, as depicted in FIG. 10A. FIG. 10B depicts an area 1020 of a grid structure 1030 from which it may be advantageous to remove mass. It may be advantageous to leave the portions of the grid structure 1030 outside of the area 1020 intact to ensure structural integrity of the grid structure 1030.

In further examples, it may be advantageous to create acoustic barrier panels that have one or more curved faces. Such a barrier may be useful in certain environments, such as aircraft engines, aircraft fuselages, and the like, that may have curvature in one or more directions. Attaching resonant membranes to support structures in non-planar positions (e.g., to curved surfaces of support structures) may be challenging. However, vacuum assisted fabrication techniques can be utilized to attach membranes in non-planar positions where the degree of curvature is limited to a single axis. Other fabrication techniques may assist in be utilized to attach membranes to the curves surfaces where the degree of curvature includes one or more axes.

A membrane-based architected acoustic barrier solution can also combine noise reflection and absorption. Such noise control results in an approach of semi-active or active tenability for noise control frequency targets.

Figure 11:
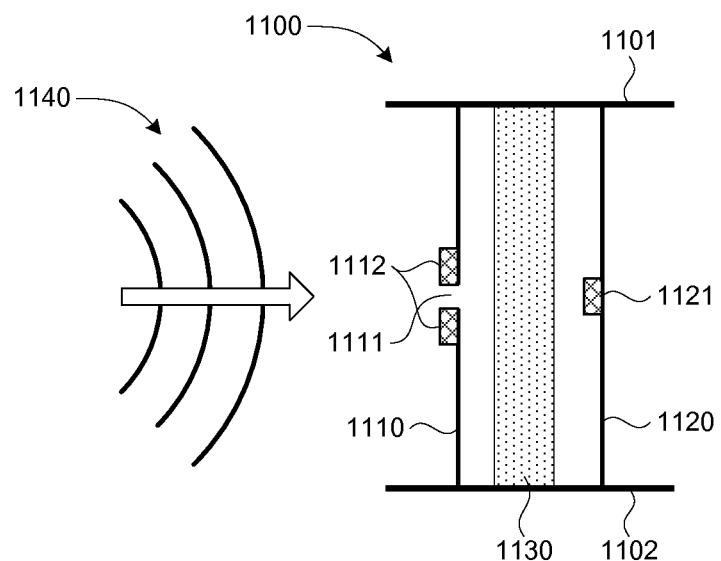
FIG. 11 depicts one example of a membrane-type hybrid Helmholtz resonator that is capable of both reflecting and absorbing noise energy.

FIG. 11 depicts one example of a membrane-type hybrid resonator 1100 that is capable of both acoustic absorption and reflection capabilities. The hybrid resonator 1100 includes two reflective anti-resonance membranes 1110 and 1120 with a small orifice 1111 in membrane 1110. The membranes 1110 and 1120 can be connected to sides 1101 and 1102 of a support structure, such as a grid support structure. Membrane 1110 can have an attached weight 1112 and membrane 1120 can have an attached weight 1121. The weight 1112 on membrane 1110 can be in the form of a ring (e.g., a washer) in order to permit at least one passage of air through the orifice 1111. The weight 1121 on membrane 1120 can be in the form of a disc, a ring, or any other form. The size and mass of the weights 1112 and 1121 can be determined based on a desired anti-resonant effect of the membranes 1110 and 1120, based on a desired Helmholtz resonator effect of the hybrid resonator 1100, or a combination of both.

Optionally, one or more absorbers 1130 can be used in conjunction with the orifice to optimize the flow resistance and acoustic absorption properties. FIG. 11 shows that absorber 1130 can be porous and placed between the two membranes 1110 and 1120 with a small air gap to permit vibrations of the membranes 1110 and 1120. Alternative absorbers include septum layers that include thin layers with semi-porous properties. Septum layers placed at specific locations within an air cavity can create multiple absorption peaks. The air enclosed between the membranes behaves like a spring as the sound waves excite the trapped air. Together with the air mass near the opening, the air spring-mass system resonates and dissipates the incident acoustic energy.

While in traditional Helmholtz absorbers, the front and back faces are assumed to be acoustically rigid wall and not used for acoustic purposes, in the example shown in FIG. 11, each of membranes 1110 and 1120 has its own anti-resonance effect which reflects and dissipates incident sound waves 1140 respectively at their anti-resonance frequency. Therefore, this membrane-type resonator design simultaneously has tunable absorption and reflection functionality and provides good noise reduction with lightweight and compact configuration. However, other configurations of two-layer Helmholtz resonators are possible. The front layer of a Helmholtz resonator can be configured to provide noise absorption, but does not necessarily have to have the form of the membrane 1110 depicted in FIG. 11. The front layer can be configured to provide noise absorption without the use of a weight. For example, the first layer can be configured to tune to a target frequency and optimize the absorption magnitude based on one or more of the thickness of the first layer, a diameter of an orifice in the first layer, spacing between multiple orifices in the first layer, and/or the distance from between the first and second layers can be selected to. In addition, no orifice may be necessary in the first layer to provide the noise absorption function of the first layer.

Figure 12A:
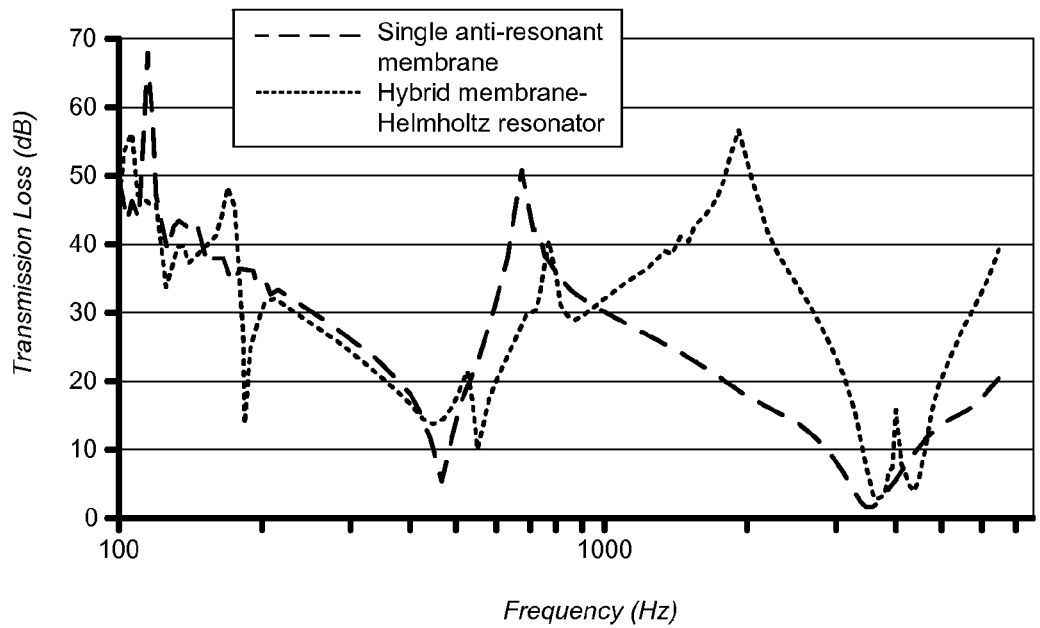
FIGS. 12A and 12B are graphs comparing the transmission loss and dissipation coefficient measurements between a single anti-resonance membrane and a membrane-type hybrid Helmholtz resonator.
Figure 12B:
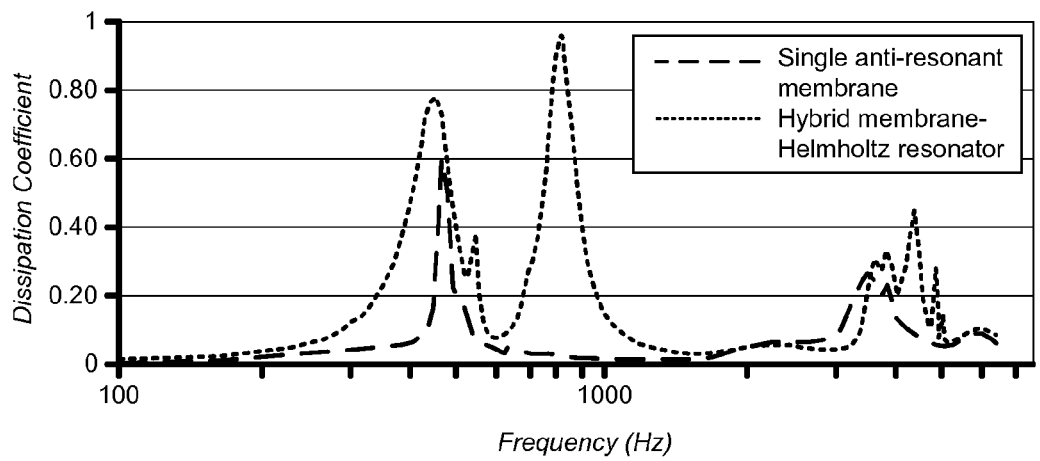

FIGS. 12A and 12B are graphs that compare the transmission loss and dissipation measurements between a single anti-resonance membrane and a membrane-type hybrid Helmholtz resonator comprising two stacked tuned membranes. FIG. 12A plots transmission loss as a function of noise frequency and FIG. 12B plots dissipation coefficient as a function of noise frequency. For the single anti-resonance membrane, first and second resonances of transmission loss dips were found to be around 470 Hz and 3500 Hz, and the anti-resonance peak was found to be around 700 Hz, as shown in FIG. 12A. For the membrane-type hybrid Helmholtz resonator, two dissipation peaks were found around frequencies corresponding resonance frequencies (470 Hz and 3500 Hz), as shown in FIG. 12B. For the hybrid membrane Helmholtz resonator, the transmission loss curve shows two groups of double first and second resonances due to a slight difference between two membranes, as shown in FIG. 12A. Meanwhile, two anti-resonances were observed between the 1st and 2nd resonance groups, as shown in FIG. 12B. An overall higher and broadband transmission loss was obtained using the membrane-type hybrid Helmholtz resonator. Furthermore, an additional dissipation coefficient peak almost up to 1 indicated the factor of combined reflection and absorption capability the membrane-type hybrid Helmholtz resonator.

Figure 13A:
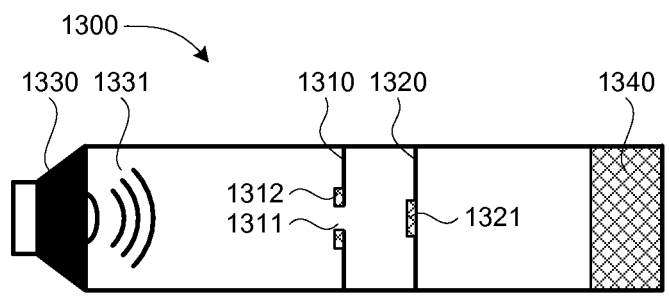
FIG. 13A depicts a test setup for testing various hybrid resonator configurations.
Figure 13B:
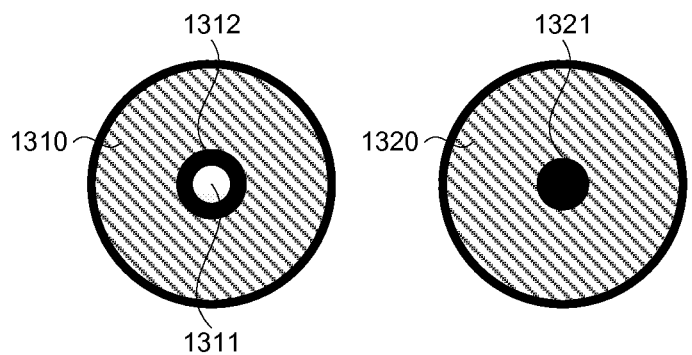
FIG. 13B depicts examples of membranes from a different angle.

FIG. 13A depicts a test setup 1300 for testing various hybrid resonator configurations. The test setup 1300 includes a first membrane 1310 and a second membrane 1320. The first membrane can include one or more orifices 1311 and one or more weights 1312. The second membrane 1320 can also have one or more weights 1321. At one end of the test setup 1300, a noise source 1330 is located to emit incident noise 1331 toward the first membrane 1310. At the other end of the test setup 1300, an anechoic barrier is placed to absorb any noise and prevent noise from returning back toward the second membrane 1320. FIG. 13B depicts examples of membranes 1310 and 1320 from another angle. As shown, first membrane 1310 can have a ring weight 1312 that surrounds an orifice 1311. Membrane 1320 can also have one or more weights 1321 in the form of a disc weight and have no orifice.

A number of variables can be used to harness the performance of the hybrid membrane Helmholtz resonator function of the two membranes 1310 and 1320. For example, the material of the membranes 1310 and 1320, the thickness of the membranes 1310 and 1320, the tension of the membranes 1310 and 1320, the distance between the membranes 1310 and 1320, the size and shape of the weights 1312 and 1321, the thickness of weight 1312 which defines the neck length of the Helmholtz resonator, any material placed between the membranes 1310 and 1320, and any other number of factors, individually and/or in combination, can all have an effect on the performance of the hybrid membrane-type Helmholtz resonator function of the two membranes 1310 and 1320.

Figure 13C:
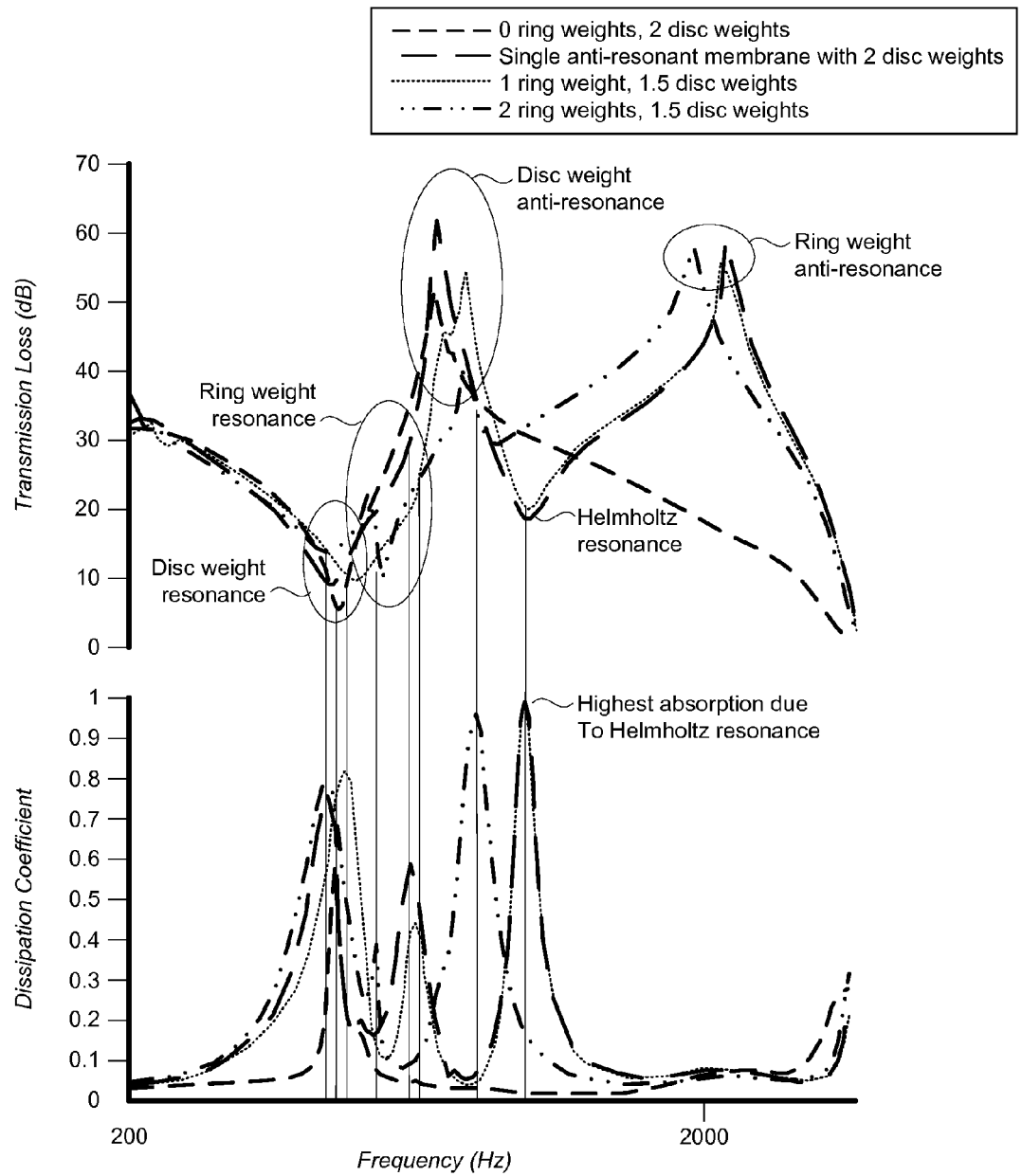
FIG. 13C depicts graphs of test data from various two-membrane hybrid resonator designs.

FIG. 13C depicts graphs of test data from various two-membrane hybrid resonator designs. By changing the weighed mass on each membrane, the anti-resonance of each membrane is tuned to implement broadband transmission loss while having high absorption at target frequency. The long-dash line indicates a design with two disc weights and one ring weight. In that case, the transmission loss graph shows two peaks and a strong dissipation coefficient is shown near 1500 Hz. However, at the same frequency, the transmission loss graph shows relatively low transmission loss due to the Helmholtz resonance. The thin dashed line indicates a design with 1.5 disc weights and one ring weight. In that case, the first transmission loss peak moves up to higher frequency without change the absorption peak near 1500 Hz. The dash-dot-dot-dash line indicates a design with 1.5 disc weights and two ring weights. The two ring weights have the effect of increasing the neck size of the orifice into the Helmholtz resonator. In this case, there is a strong absorption peak at a lower frequency. At that frequency, the transmission loss graph shows a higher level of transmission loss, above 30 dB. By adjusting the parameters in the testing setup 1300, the hybrid resonator can be tuned to create desirable transmission loss over a large band of frequencies and absorption over a moderate, targeted band of frequencies. The parameters can be further adjusted, such as by adjusting the masses of the weights, the size of the weights, using materials with different densities, and the like, many different behaviors can be created to match the transmission loss and absorption requirements of a specific application. Furthermore, adding absorbent materials, such as acoustic foams/fibers, into the cavity can effectively improve both transmission loss and absorption of the hybrid membrane Helmholtz resonators.

There are several material options to build the membrane-type resonators. The resonator can be transparent if transparent membranes are used. In the enclosure with heat-generated components, thermal conductivity of the membrane may be desirable to increase heat dissipation. For example, the thermal insulation required in applications such as commercial aircraft cabins or helicopter fuselages, the membrane can be coated with heat reflection layer to reflect back the heat energy. Heat insulating fibers can also be integrated between membranes to provide acoustic and thermal insulation simultaneously.

Figure 14A:
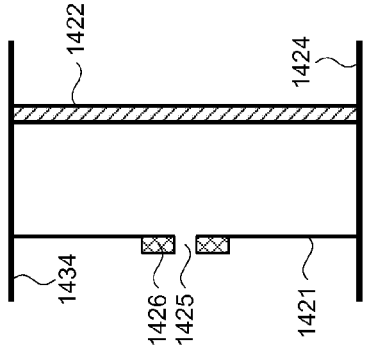

FIGS. 14A-14F depict various examples of possible configurations for membrane-type hybrid Helmholtz resonators. FIG. 14A depicts a hybrid resonator design with a first membrane 1401 and a second membrane 1402 held between a first wall 1403 of a support structure and a second wall 1404 of the support structure. The first membrane 1401 includes an orifice 1405 and a first weight 1406. The first weight 1406 can be in the shape of a ring to define a neck for the Helmholtz chamber. The second membrane 1402 can include a second weight 1407. The absorption frequency of the hybrid resonator can be varied by modifying one or more of the air cavity formed between the two membranes 1401 and 1402 and the walls 1403 and 1404, the neck length of the orifice 1405 that is defined by the thickness of the first weight 1406, and the size of the orifice 1405. The reflection performance of the hybrid resonator can be varied by modifying one or more of the tension of the two membranes 1401 and 1402, the material properties of the two membranes 1401 and 1402, the size of the two membranes 1401 and 1402, the stiffening pattern on the two membranes 1401 and 1402, the added shape memory alloy or viscoelastic materials on the two membranes, the thickness of the two membranes 1401 and 1402, the material of the two membranes 1401 and 1402, the masses of the weights 1406 and 1407, the sizes of the weights 1406 and 1407, and the locations of the weights 1406 and 1407. The shape of orifice 1405 does not necessarily need to be a circle, and can be any other shape, such as a triangle, a square, a rectangle, and the like. It may also be that shaping the orifice 1405 through its depth can provide additional control over absorption properties.

Figure 14B:
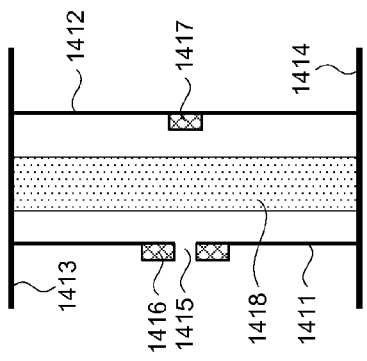

FIG. 14B depicts a hybrid resonator design with a first membrane 1411 and a second membrane 1412 held between a first wall 1413 of a support structure and a second wall 1414 of the support structure. The first membrane 1411 includes an orifice 1415 and a first weight 1416. The first weight 1416 can be in the shape of a ring to define a neck for the Helmholtz chamber. The second membrane 1412 can include a second weigh 1417. Unlike the example depicted in FIG. 14A, the example depicted in FIG. 14B also includes an absorber 1418. The absorber 1418 can be porous or fibrous, such as an open cell foam or glass fiber materials. The absorption magnitude and bandwidth of the Helmholtz cavity can be optimized using specific absorber materials. The absorber 1418 can also affect the flow of sound waves through the Helmholtz cavity and flow resistivity of the absorber 1418 can be optimized by selection of certain absorber materials. To prevent contact between the absorber 1418 and the membranes 1411 and 1412, an air gap can be maintained between the absorber 1418 and each of the membranes 1411 and 1412. The air gap can be minimized, such as an air gap in the range of about 1 mm to about 2 mm, to allow for maximizing the size of the absorber 1418 between the membranes 1411 and 1412.

Figure 14C:
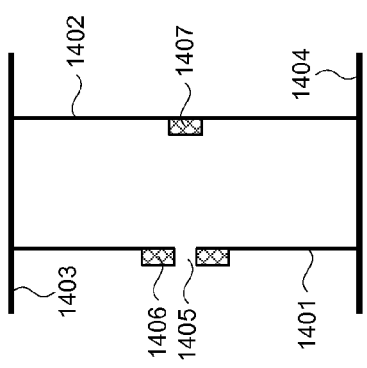

FIG. 14C depicts a hybrid resonator design with a membrane 1421 and a back wall 1422 held between a first wall 1423 of a support structure and a second wall 1424 of the support structure. The membrane 1421 includes an orifice 1425 and a weight 1426. The weight 1426 can be in the shape of a ring to define a neck for the Helmholtz chamber. The back wall 1422 can be a thin sheet or plate. The back wall 1422 may provide other functions, such as structural or thermal load protection and can be a portion of the system such as an enclosure casing and a protection sheet of devices. While such a back wall 1422 may not provide membrane type acoustic reflection, the Helmholtz chamber formed by the membrane 1421 and the back wall 1422. Minimal stiffness may be required to maintain sufficient stiffness for the Helmholtz chamber.

Figure 14D:
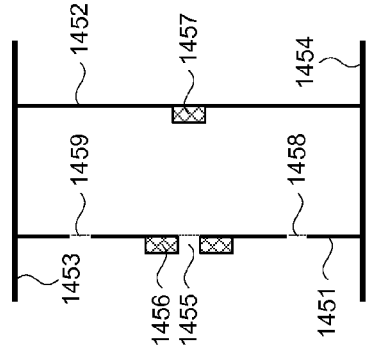

FIG. 14D depicts a hybrid resonator design with a first membrane 1431 and a second membrane 1432 held between a first wall 1433 of a support structure and a second wall 1434 of the support structure. The first membrane 1431 includes an orifice 1435 and a first weight 1436. The first weight 1436 can be in the shape of a ring to define a neck for the Helmholtz chamber. The second membrane 1432 can include a second weigh 1437. Unlike the example depicted in FIG. 14A, the example depicted in FIG. 14D also includes a septum layer 1438 that can increase energy absorption. The septum layer 1438 can be of prescribed flow resistivity or acoustic impedance depending on the requirements of the application. The location of the septum layer 1438 in the depth direction of the cell can be used to create a multiple cavity effect within a single enclosed Helmholtz chamber. Such a multiple cavity effect may be effective in broadening the absorption of the resonator.

Figure 14E:
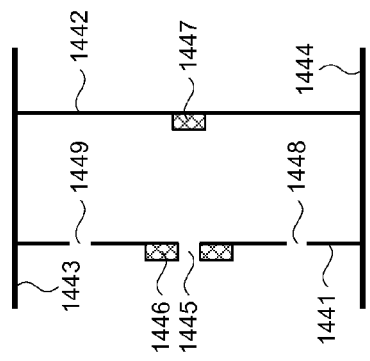

FIG. 14E depicts a hybrid resonator design with a first membrane 1441 and a second membrane 1442 held between a first wall 1443 of a support structure and a second wall 1444 of the support structure. The first membrane 1441 includes an orifice 1445 and a first weight 1446. The first weight 1446 can be in the shape of a ring to define a neck for the Helmholtz chamber. The second membrane 1442 can include a second weigh 1447. Unlike the example depicted in FIG. 14A, in the example depicted in FIG. 14E, the first membrane 1441 can include multiple perforations 1448 and 1449. A multiple perforated design can affect the absorption frequency and absorption performance of the Helmholtz chamber due to the changes of air mass around the perforations on the first membrane 1441. By changing the aspect ratio of the orifice 1445 and the perforations 1448 and 1449 while simultaneously controlling the mass and area fraction of the first weight 1446, different absorption and reflection peaks can be created. The perforations' size and neck length can be either the same to increase absorption for single frequency absorption or different to cover a wider frequency range for various applications. In the case where added neck length and/or defining of an orifice size is desirable without adding significant weight, a lightweight tube may be used to define the size of the orifice and/or increase the neck length of the orifice without adding significant weight. In other examples, a weight can have a tapered shape, such as in the case of a tapered ring. A tapered ring can have a larger inner diameter on the side of the ring away from the membrane and a smaller inner diameter on side of the ring close to the membrane. The tapered shape can have an effect on the Helmholtz adsorption by the Helmholtz cavity.

Figure 14F:
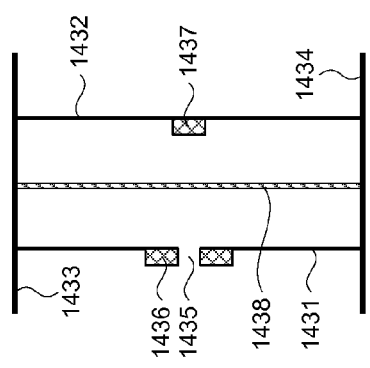

FIG. 14F depicts a hybrid resonator design with a first membrane 1451 and a second membrane 1452 held between a first wall 1453 of a support structure and a second wall 1454 of the support structure. The first membrane 1451 includes an orifice 1455 and a first weight 1456. The first weight 1456 can be in the shape of a ring to define a neck for the Helmholtz chamber. The second membrane 1452 can include a second weigh 1457. Unlike the example depicted in FIG. 14A, in the example depicted in FIG. 14F, the first membrane 1451 can include multiple perforations 1458 and 1459. Furthermore, unlike the example depicted in FIG. 14E, in the example depicted in FIG. 14F, each of the orifice 1455 and the perforations 1458 and 1459 has a micro-perforated cover. The holes in the micro-perforated covers over the orifice 1455 and the perforations 1458 and 1459 are smaller than the sizes of the orifice 1455 and the perforations 1458 and 1459. These micro-perforations can provide additional energy dissipation in a compact space.

Any of the hybrid resonators described herein can be used as a single cell or in an array of cells. For example, in the example depicted in FIG. 4, the individual integrated membranes 420 in the array can be hybrid resonators. In a planar array configuration, large areas could be covered while maintaining the properties achieved by a single hybrid resonator. In general, each of the integrated membranes 420 in an array will have the same anti-resonant membrane design. In a larger array, if the reflective features of even one cell were different in a non-insubstantial manner, the array would have a "hole" (i.e., the different cell) through which noise could be transmitted and lead to significant loss of isolation performance. In contrast, the absorption properties have more options because all cells do not need to be uniform. If all cells were configured to absorb sound in a single frequency range, absorption will be maximized at that frequency range. If cells in an array were configured to absorb sound in a different frequency ranges, the array could provide a bandwidth of frequency absorption. It may be desirable to keep cell volume uniform, preventing tuning by modification of cell volume. However, the absorption frequencies of each cell can still be modified by changing the length and area of the orifice. Absorption frequencies of cells can also be modified by incorporating septum layers to partially divide the cells into sub-volumes. By placing septum layers at different locations in different cells, the volume of the resonant cavities of the cells can be varied, thus creating a range of absorption among an array of cells.

FIG. 14G depicts a design of a series of hybrid resonators. A support structure includes a number of structural members 1461 that define cell walls. The cells can have back layers 1462. The back layers 1462 can include masses 1463. The cells can also have front layers 1464. The front layers 1464 can include masses; however, as shown in FIG. 14G, masses are not necessary on front layers 1464. Additionally, the front layers 1464 can include one or more orifices, though orifices also are not necessary. It may be advantageous to have front and back layers that do not have orifices as having front and back layers with no orifices can contain any of the masses 1463 that come loose from back layers 1462 and can reduce or eliminate the risk of foreign contaminants entering the cells. The front layers 1464 can be configured to target frequency such that absorption magnitude at the target frequency is within a predetermined range. The configuration of the front layers 1464 can be based on one or more of thickness of the front layers 1464, a diameter of an orifice in the front layers 1464, hole spacing between orifices in the front layers 1646, and distances between the front layers 1464 and the back layers 1462.

FIG. 14H depicts a design of a series of hybrid resonators. A support structure includes a number of exterior structural members 1471 and interior structural members 1472 that define cell walls. As shown in FIG. 14H, the interior structural members 1472 may not extend as far forward (i.e., to the left in FIG. 14H) as the exterior structural members 1471. The cells can have back layers 1473. The back layers 1473 can include masses 1474. The cells can also have a single front layer 1475 that is connected to the exterior structural members 1471. Even though the interior structural members 1472 do not extend far enough forward to contact the front layer 1475, the front layer 1475 can still provide sufficient noise absorption for performance of the hybrid resonators. The front layer 1475 can be configured to target frequency such that absorption magnitude at the target frequency is within a predetermined range. The configuration of the front layer 1475 can be based on one or more of thickness of the front layer 1475, a diameter of an orifice in the front layer 1475, hole spacing between orifices in the front layer 1475, and distances between the front layer 1475 and the back layers 1473.

Figure 15:
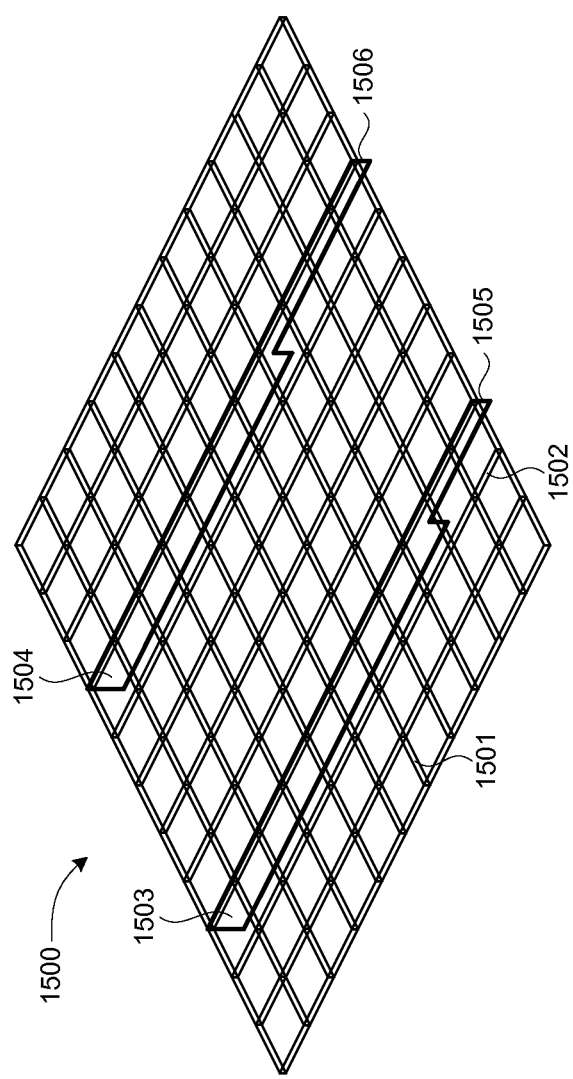
FIG. 15 depicts an examples of a support structure 1500 divided into a grid with sub-grid structures that increase grid resonance frequency.

FIG. 15 depicts an examples of a support structure 1500 divided into a grid with sub-grid structures that increase grid resonance frequency. Support structure 1500 includes a number of vertical structural members 1501 and a number of horizontal structural members 1502. A subset of the horizontal structural members 1502 has been replaced with stiffeners 1503 and 1504. Stiffeners 1503 and 1504 can have greater bending stiffness than the horizontal structural members 1502 to place modes of the support structure 1500 within a predetermined frequency range. The stiffeners 1503 and 1504 can have fixed support ends 1505 and 1506, respectively. While the depiction shown in FIG. 15 shows stiffeners 1503 and 1504 used in place of a subset of horizontal structural members 1502, other stiffeners could also be used in place of a subset of vertical structural members 1501.

Figure 16A:
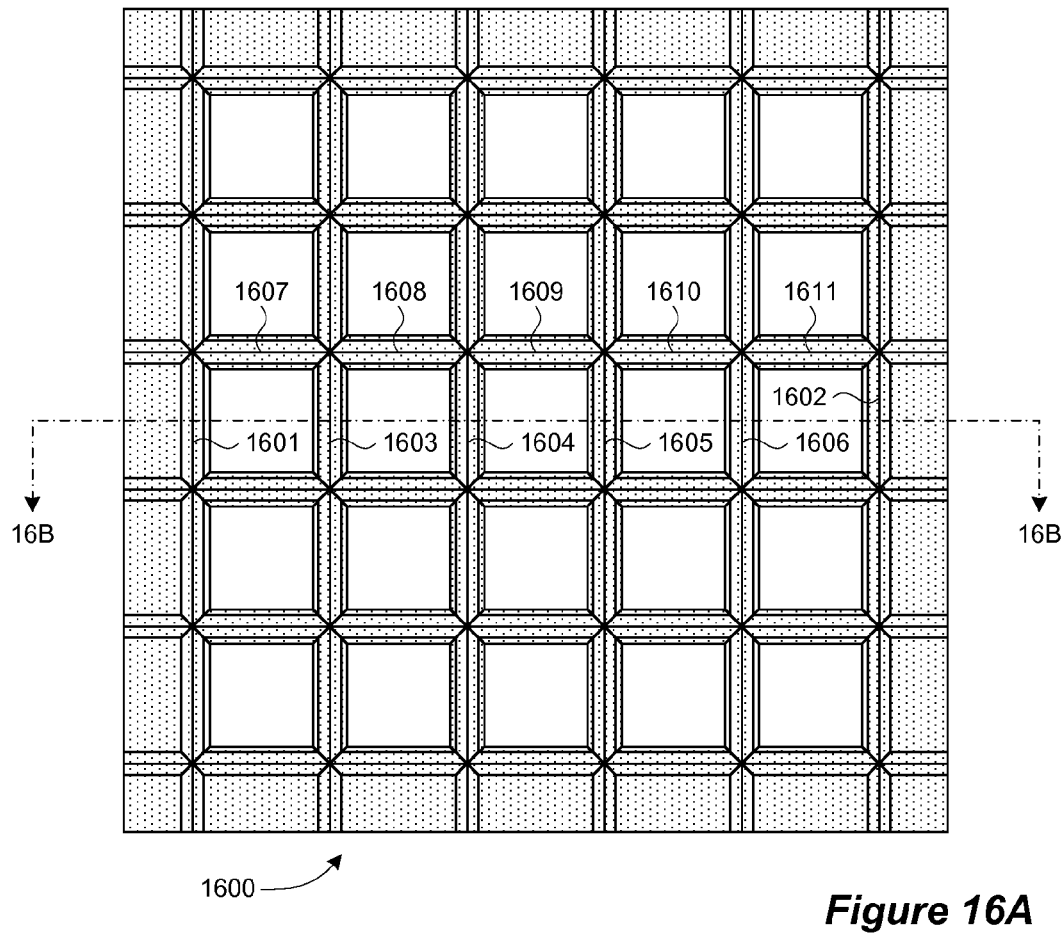
FIGS. 16A and 16B depict an example of a support structure formed of thermoplastic formed composite grids.
Figure 16B:
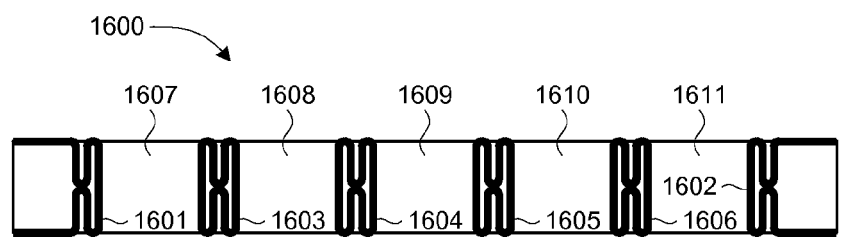

FIGS. 16A and 16B depict an example of a support structure 1600 formed of thermoplastic formed composite grids. FIG. 16A depicts a top view of the support structure 1600 that includes external vertical support members 1601 and 1602 and interior vertical support members 1603, 1604, 1605, and 1606. The support structure 1600 also includes external and internal horizontal support members. Portions of one interior horizontal support member 1607, 1608, 1609, 1610, and 1611 are also marked. The horizontal and vertical support members can be made from thermoplastic formed composite materials. FIG. 16B depicts a cross-sectional view of support structure 1600, including cross-sectional view of the external vertical support members 1601 and 1602 and the interior vertical support members 1603, 1604, 1605, and 1606, and frontal views of the portions of the one interior horizontal support member 1607, 1608, 1609, 1610, and 1611. While the examples here have been described in terms of thermoplastic formed composites, other materials may be used, such as a thermoset and composite resin material.

Figure 16C:
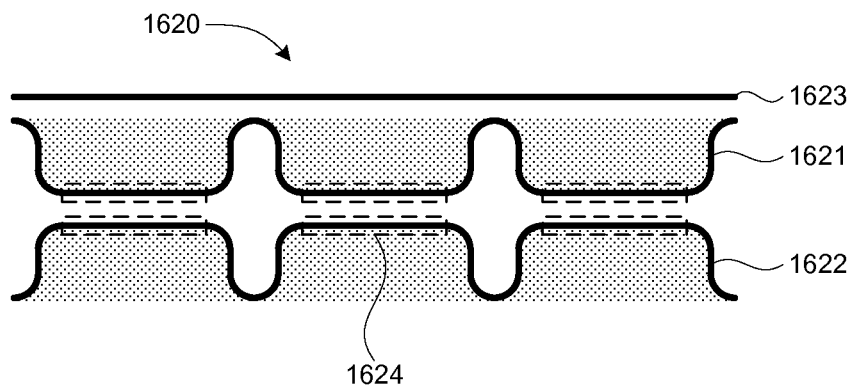
FIGS. 16C and 16D depict two examples of membrane and thermoplastic formed composite grid sandwiching options.
Figure 16D:
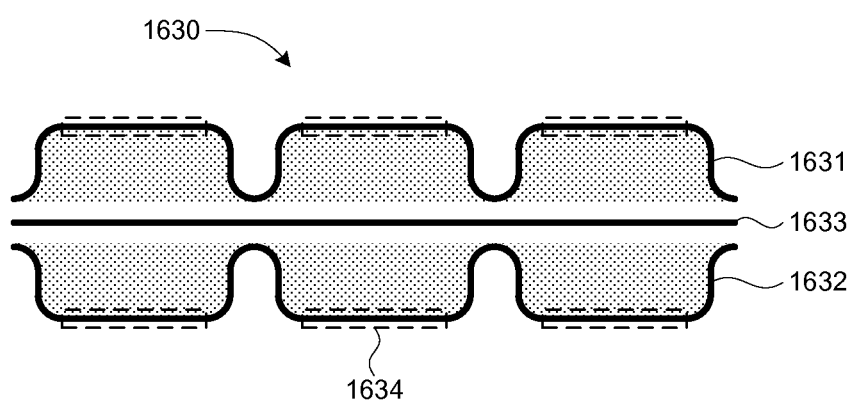

FIGS. 16C and 16D depict two examples of sandwiching arrangements 1620 and 1630 of membrane and thermoplastic formed composite grids. In the arrangement 1620 depicted in FIG. 16C, an upper grid 1621 is located over a lower grid 1622 and a membrane 1623 is located over the upper grid 1621. Cutout portions 1624 of the upper and lower grids 1621 and 1622 are also shown. The cutout portions 1624 can be cut away to form cells of a support structure. In the arrangement 1630 depicted in FIG. 16D, an upper grid 1631 is located over a lower grid 1632 and a membrane 1633 is located between the upper grid 1631 and the lower grid 1632. Cutout portions 1634 of the upper and lower grids 1631 and 1632 are also shown. The cutout portions 1634 can be cut away to form cells of a support structure.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

In general, the various features and processes described above may be used independently of one another, or may be combined in different ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example examples. The example systems and components described herein may be configured differently than described. For example, elements may be added to, removed from, or rearranged compared to the disclosed example examples.

While certain example or illustrative examples have been described, these examples have been presented by way of example only, and are not intended to limit the scope of the inventions disclosed herein. Indeed, the novel methods and systems described herein may be embodied in a variety of other forms. The accompanying claims and their equivalents are intended to cover such forms or modifications as would fall within the scope and spirit of certain of the inventions disclosed herein.

What is claimed:

1. A hybrid resonator with acoustic absorption and reflection capabilities, comprising:
   a rigid structure; and
   a front and back layer attached to the rigid structure;
   wherein the front layer is configured to reflect acoustic waves in a predetermined range of frequencies; and
   wherein the rigid structure, the front layer, and the back layer define a Helmholtz cavity, and wherein the Helmholtz cavity is configured to absorb acoustic energy at a frequency within the predetermined range of frequencies.

2. The hybrid resonator of claim 1, wherein the front layer is configured to reflect acoustic waves at an anti-resonance frequency.

3. The hybrid resonator of claim 1, wherein the front layer comprises a plurality of orifices.

4. The hybrid resonator of claim 1, wherein the front layer comprises at least one orifice having a plurality of perforations, wherein a size of each of the plurality of perforations is smaller than a size of the at least one orifice.

5. The hybrid resonator of claim 1, wherein the at least one of the front layer and the back layer is a membrane.

6. The hybrid resonator of claim 1, wherein the back layer comprises a weight and is configured to reflect acoustic waves in the predetermined range of frequencies.

7. The hybrid resonator of claim 1, wherein the back layer comprises one or more of a structural sheet and a plate.

8. The hybrid resonator of claim 1, wherein the front layer comprises a weight.

9. The hybrid resonator of claim 8, wherein the weight surrounds an orifice on the front layer and defines a neck length of the orifice.

10. The hybrid resonator of claim 9, wherein the weight comprises a ring and wherein the orifice has a shape of a circle.

11. The hybrid resonator of claim 8, wherein orifice has a shape of one of the group consisting of a triangle, a square, and a rectangle.

12. The hybrid resonator of claim 8, wherein a thickness of the weight has a tapered shape.

13. The hybrid resonator of claim 1, further comprising:
an absorbent material located between the membrane and the back sheet.

14. The hybrid resonator of claim 13, wherein the absorbent material comprises a porous material.

15. The hybrid resonator of claim 13, wherein the absorbent material is located such that an air gap exists between the membrane and the absorbent material.

16. The hybrid resonator of claim 13, wherein the absorbent material comprises at least one septum layer.

17. The hybrid resonator of claim 1, wherein the front layer comprises at least one orifice and at least one tube defining a size and a neck length of the orifice.

18. An array of hybrid resonators, comprising:
a rigid structure; and
a plurality of hybrid resonators located in an array of cells, wherein the plurality of hybrid resonators comprises:
a membrane attached to the rigid structure, the membrane comprising at least one orifice, wherein the membrane is configured to reflect acoustic waves in a predetermined range of frequencies, and
a back sheet attached to the rigid structure,
wherein the rigid structure, the membrane, and the back sheet define a Helmholtz cavity.

19. The array of hybrid resonators of claim 18, wherein the hybrid resonators in the plurality of hybrid resonators are configured to reflect acoustic waves within the predetermined range of frequencies.

20. The array of hybrid resonators of claim 19, wherein ones of the plurality of hybrid resonators are configured to absorb acoustic energy at different frequencies within the predetermined range of frequencies.

21. The array of hybrid resonators of claim 19, wherein the Helmholtz cavities of the ones of the plurality of hybrid resonators have substantially similar sizes, and wherein the ones of the plurality of hybrid resonators are configured to absorb acoustic energy at different frequencies based on one or more of a location of the at least one orifice on the membrane, different dimensions of ones of the at least one orifice on the membrane, a size of the at least one orifice on the membrane, a neck length of the at least one orifice on the membrane, an added weight on the membrane, and an absorbent material being located at different locations within the Helmholtz cavities of the ones of the plurality of hybrid resonators.

* * * * *

UNITED STATES PATENT AND TRADEMARK OFFICE
CERTIFICATE OF CORRECTION

PATENT NO. : 9,270,253 B2
APPLICATION NO. : 14/497184
DATED : February 23, 2016
INVENTOR(S) : Chia-Ming Chang et al.

It is certified that error appears in the above-identified patent and that said Letters Patent is hereby corrected as shown below:

Title Page

Item [57] Abstract

At line 2, delete "includes" and insert --include-- therefor.

Claims

Column 18, Claim 5, line 1, delete "the" between "wherein" and "at,".

Column 19, Claim 11, line 1, insert --the-- between "wherein" and "orifice;".

Column 19, Claim 11, line 1, delete "8" and insert --9-- therefor.

Column 20, Claim 21, line 1, delete "19" and insert --20-- therefor.

Signed and Sealed this
Twenty-sixth Day of July, 2016

Michelle K. Lee
*Director of the United States Patent and Trademark Office*